United States Patent
Kim et al.

(10) Patent No.: US 12,183,854 B2
(45) Date of Patent: Dec. 31, 2024

(54) DISPLAY DEVICE

(71) Applicant: Samsung Display Co., LTD., Yongin-si (KR)

(72) Inventors: Buem Joon Kim, Hwaseong-si (KR); Won Ho Lee, Suwon-si (KR); Hyun Deok Im, Seoul (KR); Jong Hyuk Kang, Suwon-si (KR); Eun A Cho, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 484 days.

(21) Appl. No.: 17/411,664

(22) Filed: Aug. 25, 2021

(65) Prior Publication Data

US 2022/0085246 A1   Mar. 17, 2022

(30) Foreign Application Priority Data

Sep. 11, 2020   (KR) .................. 10-2020-0116522

(51) Int. Cl.
*H01L 33/38* (2010.01)
*H01L 27/15* (2006.01)
*H01L 33/62* (2010.01)

(52) U.S. Cl.
CPC .......... *H01L 33/382* (2013.01); *H01L 27/156* (2013.01); *H01L 33/62* (2013.01)

(58) Field of Classification Search
CPC ..... H01L 33/00–648; H01L 27/15–156; H01L 2933/00–0091; H01L 25/167;

(Continued)

(56) References Cited

U.S. PATENT DOCUMENTS

| 10,600,767 B2 | 3/2020 | Chong et al. |
| 12,074,171 B2 | 8/2024 | Oh et al. |
| 2022/0085247 A1* | 3/2022 | Do ........................ H01L 25/167 |

FOREIGN PATENT DOCUMENTS

| KR | 10-1672781 | 11/2016 |
| KR | 10-2018-0009015 | 1/2018 |

(Continued)

OTHER PUBLICATIONS

International Search Report corresponding to International Application No. PCT/KR2021/012341 dated Dec. 29, 2021.

(Continued)

*Primary Examiner* — Cuong B Nguyen
*Assistant Examiner* — Anthony A Pulatov
(74) *Attorney, Agent, or Firm* — KILE PARK REED & HOUTTEMAN PLLC

(57) ABSTRACT

A display device comprises a substrate, a first electrode and a second electrode disposed on the substrate, a first insulating layer disposed on the first electrode and the second electrode, first light emitting elements disposed on the first insulating layer, a first connection electrode disposed on the first electrode to contact first ends of the first light emitting elements and a second connection electrode disposed on the second electrode to contact second ends of the first light emitting elements, a second insulating layer disposed on the first light emitting elements, the first connection electrode and the second connection electrode, second light emitting elements disposed on the second insulating layer, a third connection electrode disposed on the first connection electrode to contact first ends of the second light emitting elements, and a fourth connection electrode disposed on the second connection electrode to contact second ends of the second light emitting elements.

14 Claims, 25 Drawing Sheets

(58) Field of Classification Search
CPC . H01L 25/0753; H01L 23/481; H01L 23/485; H01L 23/528; H01L 23/5386
See application file for complete search history.

(56) References Cited

FOREIGN PATENT DOCUMENTS

| | | |
|---|---|---|
| KR | 10-2020-0070493 | 6/2020 |
| KR | 10-2020-0085977 | 7/2020 |
| KR | 10-2020-0088954 | 7/2020 |
| KR | 10-2020-0088959 | 7/2020 |

OTHER PUBLICATIONS

Written Opinion corresponding to International Application No. PCT/KR2021/012341 dated Dec. 29, 2021.
Extended European Search Report for European Application No. 21867162.6, dated Oct. 10, 2024.

\* cited by examiner

DISPLAY DEVICE

CROSS REFERENCE TO RELATED APPLICATION(S)

This application claims priority to and the benefit of Korean Patent Application No. 10-2020-0116522 under 35 U.S.C. § 119, filed on Sep. 11, 2020 in the Korean Intellectual Property Office (KIPO), the entire contents of which are incorporated herein by reference.

BACKGROUND

1. Technical Field

The disclosure relates to a display device.

2. Description of the Related Art

Display devices are becoming increasingly important with the development of multimedia. Accordingly, various types of display devices such as organic light emitting displays and liquid crystal displays have been used.

A display device is a device for displaying an image and includes a display panel such as an organic light emitting display panel or a liquid crystal display panel. As a light emitting display panel, the display panel may include light emitting elements such as light emitting diodes (LEDs). For example, the LEDs may be organic light emitting diodes (OLEDs) using an organic material as a light emitting material or may be inorganic LEDs using an inorganic material as the light emitting material.

SUMMARY

Aspects of the disclosure provide a display device which includes a plurality of light emitting elements disposed in a thickness direction and electrically connected to each other.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may comprise a substrate, a first electrode and a second electrode which are disposed on the substrate and spaced apart from each other, a first insulating layer which is disposed on the first electrode and the second electrode, a plurality of first light emitting elements which are disposed on the first insulating layer, each of the plurality of first light emitting elements including a first end and a second end disposed on the first electrode and the second electrode, respectively, a first connection electrode which is disposed on the first electrode to electrically contact the first end of each of the plurality of first light emitting elements, a second connection electrode which is disposed on the second electrode to electrically contact the second end of each of the plurality of first light emitting elements, a second insulating layer which is disposed on the plurality of first light emitting elements, the first connection electrode, and the second connection electrode, a plurality of second light emitting elements which are disposed on the second insulating layer, each of the plurality of second light emitting elements including a first end and a second end disposed on the first electrode and the second electrode, respectively, and a third connection electrode which is disposed on the first connection electrode to electrically contact the first end of each of the plurality of second light emitting elements, and a fourth connection electrode which is disposed on the second connection electrode to electrically contact the second end of each of the plurality of second light emitting elements.

At least a part of the plurality of first light emitting elements may overlap the plurality of second light emitting elements in a thickness direction of the display device.

Each of the plurality of first light emitting elements and each of the plurality of second light emitting elements may comprise a first semiconductor layer, a second semiconductor layer, and a light emitting layer disposed between the first semiconductor layer and the second semiconductor layer, and the first end of each first light emitting element at which the first semiconductor layer is disposed and the first end of each second light emitting element at which the first semiconductor layer is disposed may face opposite directions.

The first connection electrode may electrically contact the first electrode through a first contact portion penetrating the first insulating layer, the fourth connection electrode may electrically contact the second connection electrode through a second contact portion penetrating the second insulating layer, and the third connection electrode may electrically contact the second electrode through a third contact portion penetrating the first insulating layer and the second insulating layer.

The third connection electrode may comprise an electrode extension portion disposed across the first electrode and the second electrode, and the electrode extension portion may electrically contact the second electrode through the third contact portion.

The second connection electrode may not be directly connected to the first electrode and the second electrode.

The display device may further comprise a conductive layer which comprises a plurality of voltage wirings and a conductive pattern disposed on the substrate, and a via layer which is disposed between the conductive layer and the first and second electrodes, wherein the first electrode may be electrically connected to the conductive pattern through a first electrode contact hole penetrating the via layer, and the second electrode may be electrically connected to one of the plurality of voltage wirings through a second electrode contact hole penetrating the via layer.

The display device may further comprise an emission area and a subarea which is spaced apart from the emission area in a first direction, wherein the plurality of first light emitting elements and the plurality of second light emitting elements may be disposed in the emission area, the first electrode and the second electrode may extend in the first direction across the emission area and the subarea, and the first contact portion and the third contact portion may be disposed in the subarea.

The display device may further comprise a third electrode which is spaced apart from the first electrode, the second electrode being disposed between the first electrode and the third electrode, a plurality of third light emitting elements which are disposed on the first insulating layer, the second electrode, and the third electrode, and a plurality of fourth light emitting elements which are disposed on the second electrode and the third electrode, wherein the second insulating layer may be also disposed on the plurality of third light emitting elements, and the plurality of fourth light emitting elements may be directly disposed on the second insulating layer.

The first connection electrode may comprise a first portion disposed on the first electrode, a second portion disposed on the third electrode to electrically contact a first end of each of the plurality of third light emitting elements, and a third portion electrically connecting the first portion and the second portion, the third connection electrode may comprise a fourth portion disposed on the first portion, a fifth portion disposed on the second portion to electrically contact a first end of each of the plurality of fourth light emitting elements, and a sixth portion electrically connecting the fourth portion and the fifth portion, the second connection electrode may electrically contact a second end of each of the plurality of third light emitting elements, and the fourth connection electrode may electrically contact a second end of each of the plurality of fourth light emitting elements.

The display device may further comprise a third insulating layer which is disposed on the plurality of second light emitting elements, the third connection electrode, and the fourth connection electrode, a plurality of third light emitting elements which are disposed on the third insulating layer, each of the plurality of third light emitting elements including a first end and a second end disposed on the first electrode and the second electrode, a fifth connection electrode which is disposed on the third connection electrode to electrically contact the first end of each of the plurality of third light emitting elements, and a sixth connection electrode which is disposed on the fourth connection electrode to electrically contact the second end of each of the plurality of third light emitting elements.

The display device may further comprise a first bank which is disposed on the first insulating layer to surround an area in which the plurality of first light emitting elements and the plurality of second light emitting elements are disposed, wherein the second insulating layer may be also disposed on the first bank.

The display device may further comprise a fourth insulating layer which is disposed between the plurality of first light emitting elements and the second insulating layer, and a fifth insulating layer which is disposed on the plurality of second light emitting elements, wherein a portion of the first connection electrode and a portion of the second connection electrode may be disposed on the fourth insulating layer, and a portion of the third connection electrode and a portion of the fourth connection electrode are disposed on the fifth insulating layer.

The display device may further comprise a sixth insulating layer which is disposed between the second connection electrode and the second insulating layer, and a seventh insulating layer which is disposed on the fourth connection electrode, wherein a portion of the first connection electrode may be disposed on the sixth insulating layer, and a portion of the third connection electrode may be disposed on the seventh insulating layer.

The display device may further comprise a plurality of second banks which are disposed between the substrate and the first electrode and between the substrate and the second electrode and are spaced apart from each other, wherein the plurality of first light emitting elements may be disposed between the plurality of second banks.

According to an embodiment of the disclosure, a display device may comprise an emission area and a subarea which is spaced apart from the emission area in a first direction, a plurality of electrodes which extend in the first direction across the emission area and the subarea and are spaced apart from each other in a second direction, the plurality of electrodes comprising a first electrode, a second electrode spaced apart from the first electrode in the second direction, a third electrode disposed between the first electrode and the second electrode, and a fourth electrode spaced apart from the third electrode in the second direction, the second electrode disposed between the third electrode and the fourth electrode, a plurality of light emitting elements which are disposed on the plurality of electrodes spaced apart in the second direction, the plurality of light emitting elements comprising a plurality of first light emitting elements and a plurality of second light emitting elements disposed on the first electrode and the third electrode, and a plurality of third light emitting elements and a plurality of fourth light emitting elements disposed on the second electrode and the fourth electrode, a first connection electrode which is disposed on the first electrode to electrically contact the plurality of first light emitting elements, a second connection electrode which is disposed on the second electrode to electrically contact the plurality of third light emitting elements, a third connection electrode which is disposed on the first connection electrode to electrically contact the plurality of second light emitting elements, a fourth connection electrode which is disposed on the second connection electrode to electrically contact the plurality of fourth light emitting elements, a fifth connection electrode which is disposed on the third electrode and the fourth electrode to electrically contact the plurality of first light emitting elements and the plurality of third light emitting elements, and a sixth connection electrode which is disposed on the fifth connection electrode to electrically contact the plurality of second light emitting elements and the plurality of fourth light emitting elements.

The display device may further comprise a first insulating layer which is disposed on the plurality of electrodes, and a second insulating layer which is disposed on the first insulating layer, wherein the plurality of first light emitting elements and the plurality of third light emitting elements may be disposed between the first insulating layer and the second insulating layer, and the plurality of second light emitting elements and the plurality of fourth light emitting elements may be disposed on the second insulating layer.

The first connection electrode, the second connection electrode, and the fifth connection electrode may be disposed between the first insulating layer and the second insulating layer, and the third connection electrode, the fourth connection electrode and the sixth connection electrode may be disposed on the second insulating layer.

The first connection electrode may electrically contact the first electrode through a first contact portion penetrating the first insulating layer, the fourth connection electrode may electrically contact the second connection electrode through a second contact portion penetrating the second insulating layer, the third connection electrode may electrically contact the second electrode through a third contact portion penetrating the first insulating layer and the second insulating layer, and the fifth connection electrode may electrically contact the third electrode and the fourth electrode respectively through a fourth contact portion and a fifth contact portion penetrating the first insulating layer.

At least a part of the plurality of first light emitting elements may overlap the plurality of second light emitting elements in a thickness direction of the display device, and at least a part of the plurality of third light emitting elements may overlap the plurality of fourth light emitting elements in the thickness direction of the display device.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which some embodiments of the disclosure are shown. This disclosure may, however, be embodied in different forms and should not be construed as being limited to the embodiments set forth herein. Rather, these embodiments are provided so that this disclosure will be more thorough and complete, and will convey the scope of the disclosure to those skilled in the art.

It will also be understood that when a layer is referred to as being "on" another layer or substrate, it can be directly on the another layer or substrate, or one or more intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

If two elements are "connected" or "electrically connected" to each other, the two elements may be disposed such that they are connected or electrically connected to each other, or the two elements may be integral with each other. Similarly, if an element "contacts" or "electrically contacts" another element, the element may be disposed such that the element contacts or electrically contacts the another element, or the element may be integral with the another element.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 1:
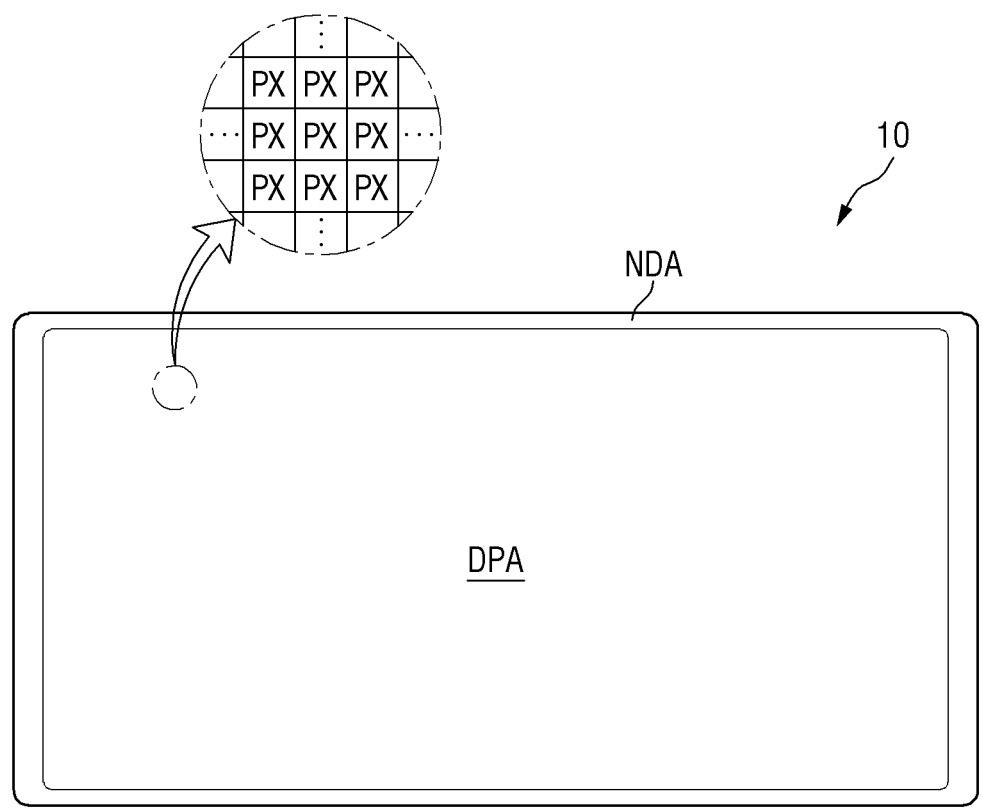
FIG. 1 is a schematic plan view of a display device according to an embodiment.

Hereinafter, embodiments will be described with reference to the accompanying drawings. FIG. 1 is a schematic plan view of a display device 10 according to an embodiment.

Referring to FIG. 1, the display device 10 displays moving images or still images. The display device 10 may refer to any electronic device that includes a display screen. Examples of the display device 10 may include televisions, laptop computers, monitors, billboards, Internet of things (IoT) devices, mobile phones, smartphones, tablet personal computers (PCs), electronic watches, smart watches, watch phones, head mounted displays, mobile communication terminals, electronic notebooks, electronic books, portable multimedia players (PMPs), navigation devices, game consoles, digital cameras and camcorders, which include a display screen.

The display device 10 may include a display panel that includes a display screen. Examples of the display panel may include inorganic light emitting diode display panels, organic light emitting display panels, quantum dot light emitting display panels, plasma display panels, and field emission display panels. A case where an inorganic light emitting diode display panel is applied as an example of the display panel will be described below, but the disclosure is not limited to this case, and other display panels can also be applied as long as the same technical spirit is applicable.

The shape of the display device 10 may be variously modified. For example, the display device 10 may have various shapes such as a horizontally long rectangle, a vertically long rectangle, a square, a quadrangle with rounded corners (vertices), other polygons, and a circle. The shape of a display area DPA of the display device 10 may also be similar to the overall shape of the display device 10. FIG. 1 illustrates that the display device 10 has the shape of a rectangle that is elongated in a second direction DR2.

The display device 10 may include the display area DPA and a non-display area NDA. The display area DPA may be an area where an image can be displayed, and the non-display area NDA may be an area where no image is displayed. The display area DPA may also be referred to as an active area, and the non-display area NDA may also be referred to as an inactive area. The display area DPA may generally occupy a center of the display device 10.

The display area DPA may include pixels PX. The pixels PX may be arranged in a matrix direction. Each of the pixels PX may be rectangular or square in a plan view. However, the disclosure is not limited thereto, and each of the pixels PX may also have a rhombic planar shape having each side inclined with respect to a direction. The pixels PX may be alternately arranged in a stripe or PENTILE™ type. Each of the pixels PX may include one or more light emitting elements which emit light of a specific wavelength band to display a specific color.

The non-display area NDA may be disposed around the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. In each non-display area NDA, wirings or circuit drivers included in the display device 10 may be disposed, or external devices may be mounted.

Figure 2:
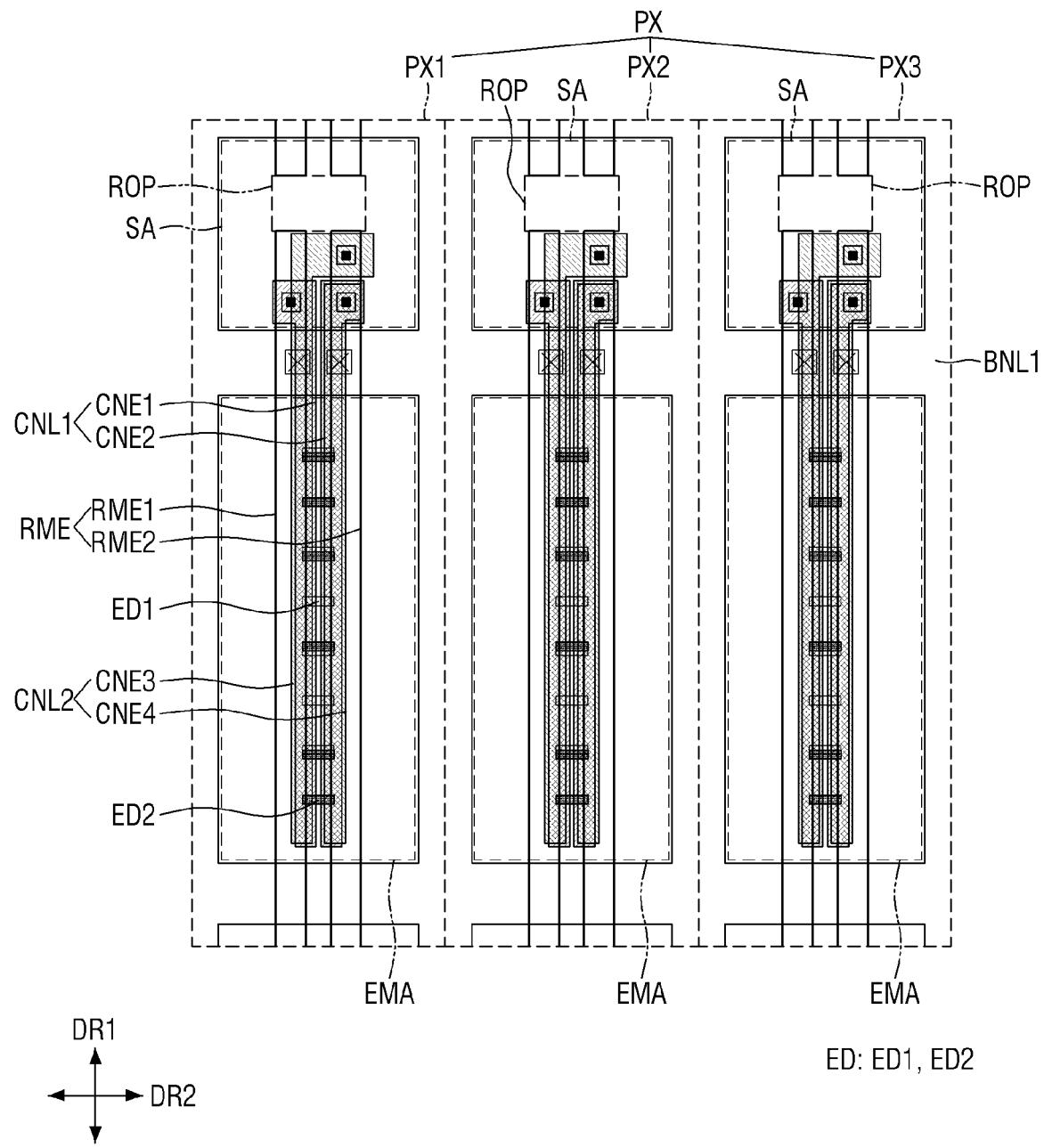
FIG. 2 is a schematic plan view of a pixel of the display device according to the embodiment.

FIG. 2 is a schematic plan view of a pixel PX of the display device 10 according to the embodiment.

Referring to FIG. 2, each of the pixels PX of the display device 10 may include subpixels PXn (where n is 1 to 3). For example, a pixel PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. For example, the first color may be blue, the second color may be green, and the third color may be red. However, the disclosure is not limited thereto, and the subpixels PXn may also emit light of the same color. Although FIG. 2 illustrates that a pixel PX includes three subpixels PXn, the disclosure is not limited thereto, and the pixel PX may also include a larger number of subpixels PXn.

Each subpixel PXn of the display device 10 may include an emission area EMA and a non-emission area (not illustrated). The emission area EMA may be an area in which light emitting elements ED are disposed to emit light of a specific wavelength band, and the non-emission area may be an area in which the light emitting elements ED are not disposed and from which no light is output because light emitted from the light emitting elements ED does not reach this area. The emission area EMA may include an area in which the light emitting elements ED are disposed and an area which is adjacent to the light emitting elements ED and to which light emitted from the light emitting elements ED is output.

However, the disclosure is not limited thereto, and the emission area EMA may also include an area from which light emitted from the light emitting elements ED is output after being reflected or refracted by other members. Light emitting elements ED may be disposed in each subpixel PXn, and an area where the light emitting elements ED are disposed and an area adjacent to this area may form the emission area EMA.

Although the respective emission areas EMA of the subpixels PXn have substantially the same area in the drawing, the disclosure is not limited thereto. In some embodiments, the emission area EMA of each subpixel PXn may have a different area according to the color or wavelength band of light emitted from the light emitting elements ED disposed in the corresponding subpixel PXn.

Each subpixel PXn may further include a subarea SA disposed in the non-emission area. The subarea SA may be disposed on a first side of the emission area EMA in a first direction DR1 and may be disposed between the emission areas EMA of subpixels PXn neighboring in the first direction DR1. For example, emission areas EMA and subareas SA may be repeatedly arranged in the second direction DR2 and may be alternately arranged in the first direction DR1. A first bank BNL1 may be disposed between the subareas SA and the emission areas EMA, and a gap between them may vary according to a width of the first bank BNL1. Light may not exit from the subarea SA because the light emitting elements ED are not disposed in the subarea SA, but portions of electrodes RME disposed in each subpixel PXn may be disposed in the subarea SA. The electrodes RME disposed in different subpixels PXn may be separated from each other in the subarea SA.

The first bank BNL1 may include portions extending in the first direction DR1 and the second direction DR2 in a plan view to form a lattice pattern over the entire display area DPA. The first bank BNL1 may be disposed at the boundary of each subpixel PXn to separate neighboring subpixels PXn. The first bank BNL1 may surround the emission area EMA and the subarea SA disposed in each subpixel PXn to separate them from each other.

Figure 3:
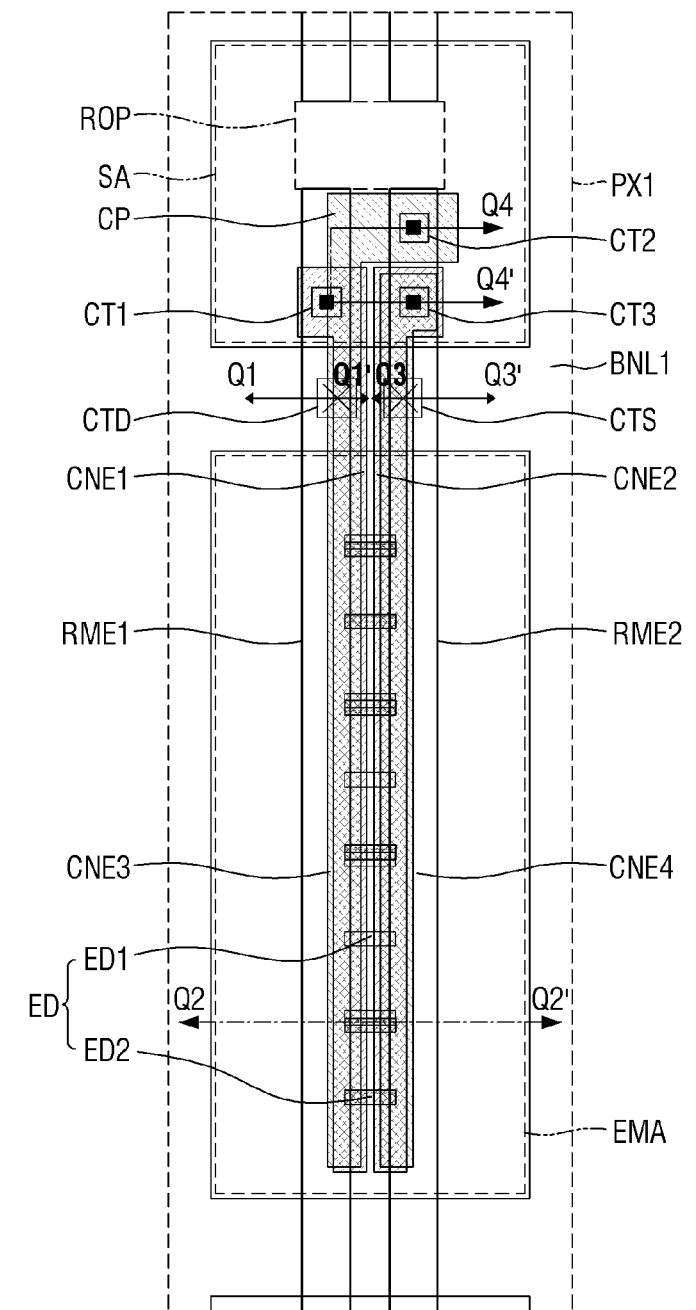
FIG. 3 is a schematic plan view of a first subpixel of FIG. 2.
Figure 4:
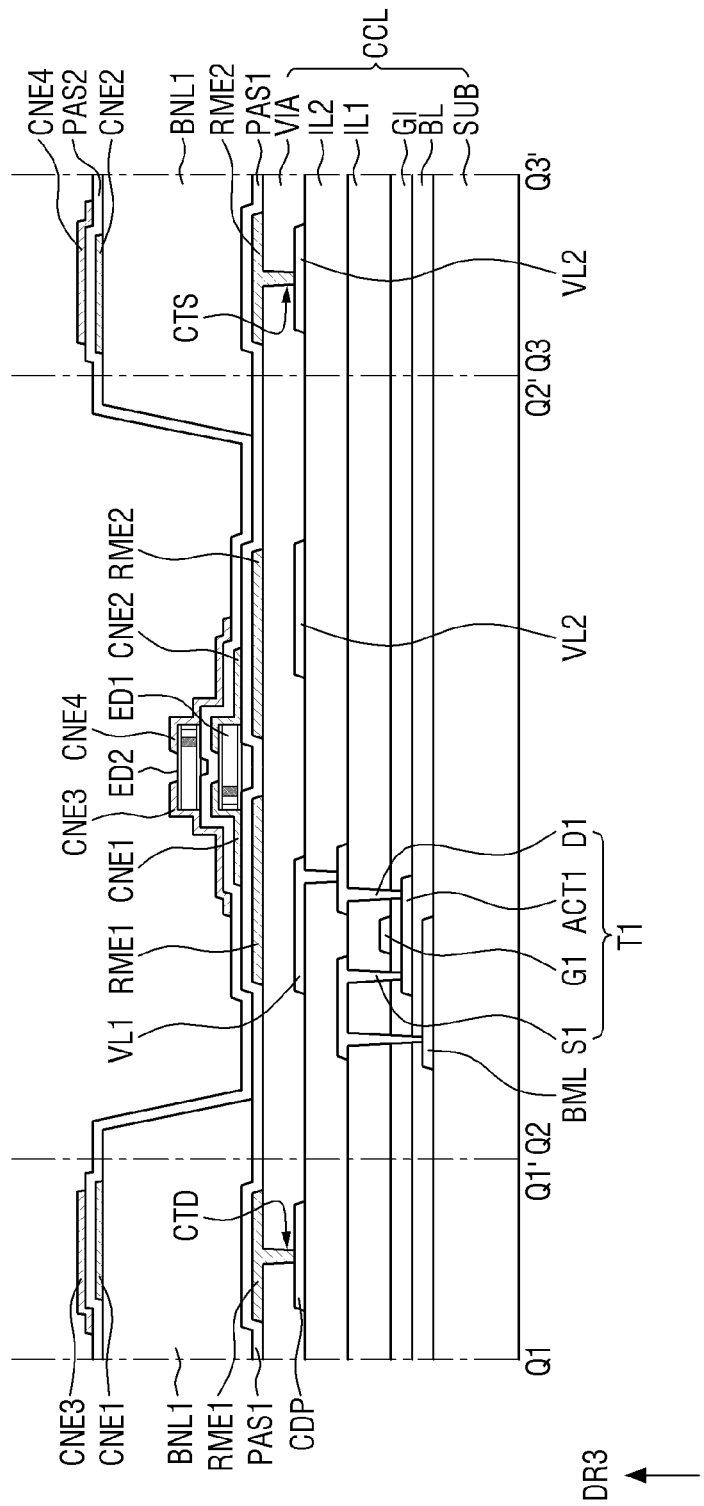
FIG. 4 is a schematic cross-sectional view taken along lines Q1-Q1', Q2-Q2', and Q3-Q3' of FIG. 3.
Figure 5:
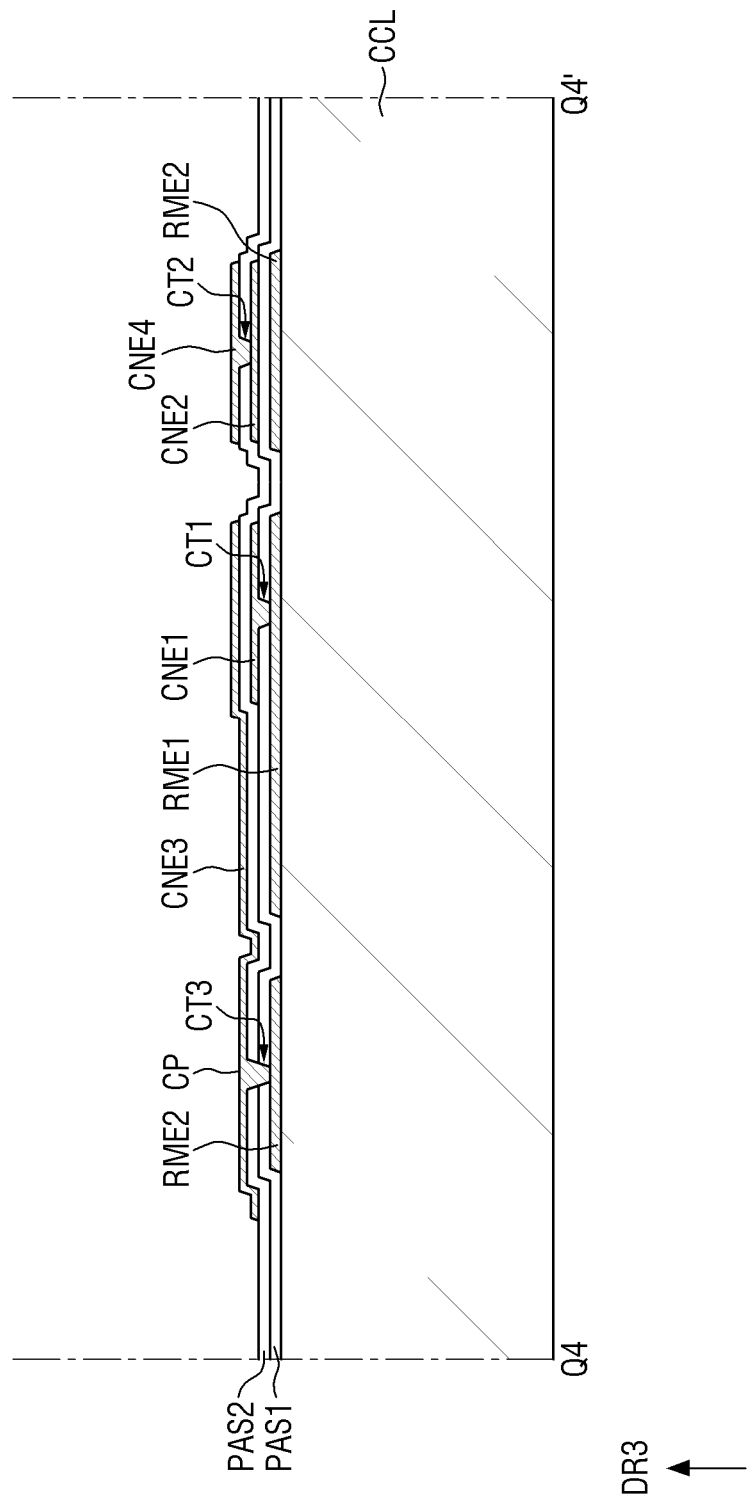
FIG. 5 is a schematic cross-sectional view taken along line Q4-Q4' of FIG. 3.

FIG. 3 is a schematic plan view of the first subpixel PX1 of FIG. 2. FIG. 4 is a schematic cross-sectional view taken along lines Q1-Q1', Q2-Q2', and Q3-Q3' of FIG. 3. FIG. 5 is a schematic cross-sectional view taken along line Q4-Q4' of FIG. 3. FIG. 3 illustrates the first subpixel PX1 included in a pixel PX, and FIG. 4 illustrates a cross section across both ends of the light emitting elements ED disposed in the first subpixel PX1. FIG. 5 illustrates a cross section of contact portions CT1, CT2, and CT3 through which connection electrodes CNE are connected.

Referring to FIGS. 2 and 3 to 5, the display device 10 may include a first substrate SUB and a semiconductor layer, conductive layers and insulating layers disposed on the first substrate SUB. The semiconductor layer, the conductive layers, and the insulating layers may form a circuit layer CCL and a display element layer of the display device 10.

The first substrate SUB may be an insulating substrate. The first substrate SUB may be made of an insulating material such as glass, quartz, or polymer resin. The first substrate SUB may be a rigid substrate but may also be a flexible substrate that can be bent, folded, rolled, etc.

A first conductive layer may be disposed on the first substrate SUB. The first conductive layer may include a bottom metal layer BML, and the bottom metal layer BML is overlapped by an active layer ACT1 of a first transistor T1. The bottom metal layer BML may include a light blocking material to prevent light from entering the active layer ACT1 of the first transistor T1. However, the bottom metal layer BML may be omitted.

A buffer layer BL may be disposed on the bottom metal layer BML and the first substrate SUB. The buffer layer BL may be formed on the first substrate SUB to protect transistors of each pixel PX from moisture introduced through the first substrate SUB which is vulnerable to moisture penetration and may perform a surface planarization function.

The semiconductor layer may be disposed on the buffer layer BL. The semiconductor layer may include the active layer ACT1 of the first transistor T1. The active layer ACT1 may be partially overlapped by a gate electrode G1 of a second conductive layer which will be described below.

The semiconductor layer may include polycrystalline silicon, monocrystalline silicon, an oxide semiconductor, or the like. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although one first transistor T1 is disposed in the subpixel PXn of the display device 10 in the drawings, but the disclosure is not limited thereto. The display device 10 may include a larger number of transistors.

A first gate insulating layer GI may be disposed on the semiconductor layer and the buffer layer BL. The first gate insulating layer GI may function as a gate insulating film of the first transistor T1.

The second conductive layer may be disposed on the first gate insulating layer GI. The second conductive layer may include the gate electrode G1 of the first transistor T1. The gate electrode G1 may overlap a channel region of the active layer ACT1 in a third direction DR3, which is a thickness direction. Although not illustrated in the drawings, the second conductive layer may further include a capacitive electrode of a storage capacitor.

A first interlayer insulating layer IL1 may be disposed on the second conductive layer. The first interlayer insulating layer IL1 may function as an insulating film between the second conductive layer and other layers disposed on the second conductive layer and may protect the second conductive layer.

A third conductive layer may be disposed on the first interlayer insulating layer ILL The third conductive layer may include a first source electrode Si and a first drain electrode D1 of the first transistor T1.

The first source electrode Si and the first drain electrode D1 of the first transistor T1 may contact or electrically contact the active layer ACT1 respectively through contact holes penetrating the first interlayer insulating layer IL1 and the first gate insulating layer GI. The first source electrode Si may contact the bottom metal layer BML through another contact hole. Although not illustrated in the drawings, the third conductive layer may further include data wirings or a capacitive electrode of the storage capacitor.

A second interlayer insulating layer IL2 may be disposed on the third conductive layer. The second interlayer insulating layer IL2 may function as an insulating film between the third conductive layer and other layers disposed on the third conductive layer and may protect the third conductive layer.

A fourth conductive layer may be disposed on the second interlayer insulating layer IL2. The fourth conductive layer may include a first voltage wiring VL1, a second voltage wiring VL2, and a first conductive pattern CDP. A high potential voltage (or a first power supply voltage) supplied to the first transistor T1 may be applied to the first voltage wiring VL1, and a low potential voltage (or a second power supply voltage) supplied to a second electrode RME2 may be applied to the second voltage wiring VL2.

The first conductive pattern CDP may be electrically connected to the first transistor T1. The first conductive pattern CDP may also be electrically connected to a first electrode RME1 to be described below, and the first transistor T1 may send the first power supply voltage received from the first voltage wiring VL1 to the first electrode RME1.

Each of the buffer layer BL, the first gate insulating layer GI, the first interlayer insulating layer IL1, and the second interlayer insulating layer IL2 described above may include inorganic layers stacked alternately. For example, each of the buffer layer BL, the first gate insulating layer GI, the first interlayer insulating layer ILL and the second interlayer insulating layer IL2 may be a double layer in which inorganic layers including at least one of silicon oxide ($SiO_x$), silicon nitride ($SiN_x$) and silicon oxynitride ($SiO_xN_y$) are stacked or may be multiple layers in which the inorganic layers are alternately stacked. However, the disclosure is not limited thereto, and each of the buffer layer BL, the first gate insulating layer GI, the first interlayer insulating layer ILL and the second interlayer insulating layer IL2 may also be an inorganic layer including at least one of the above insulating materials.

Each of the second conductive layer, the third conductive layer, and the fourth conductive layer may be, but is not limited to, a single layer or a multi-layer made of one or more of molybdenum (Mo), aluminum (Al), chromium (Cr), gold (Au), titanium (Ti), nickel (Ni), neodymium (Nd), and copper (Cu), and alloys thereof.

A via layer VIA may be disposed on the fourth conductive layer. The via layer VIA may include an organic insulating material, for example, an organic material such as polyimide (PI) and perform a surface planarization function.

Electrodes RME, the first bank BNL1, light emitting elements ED1 and ED2, and connection electrodes CNE (CNE1 through CNE4) may be disposed as the display element layer on the via layer VIA. Insulating layers PAS1 and PAS2 may be disposed on the via layer VIA.

The electrodes RME may extend in a direction and may be disposed in each subpixel PXn. The electrodes RME may extend in the first direction DR1 and may be spaced apart from each other in the second direction DR2 in each subpixel PXn.

For example, a subpixel PXn may include electrodes RME extending in the first direction DR1 across the emission area EMA and the subarea SA. The electrodes RME of subpixels PXn neighboring in the first direction DR1 may be separated from each other in a separation portion ROP of the subarea SA. In a process of manufacturing the display device 10, the electrodes RME may be formed as electrode lines extending in the first direction DR1 and utilized to generate an electric field in each subpixel PXn to align the light emitting elements ED. The light emitting elements ED may be aligned by a dielectrophoretic force from an electric field generated on the electrode lines, and the electrode lines may be separated in the separation portion ROP to form the electrodes RME.

Although the electrodes RME are spaced apart from each other in the separation portion ROP of the subarea SA in the drawings, but the disclosure is not limited thereto. In some embodiments, the electrodes RME disposed in each subpixel PXn may be spaced apart from each other in the separation portion ROP formed in the emission area EMA. In this case, the electrodes RME may be divided into an electrode group located on a side of the separation portion ROP of the emission area EMA and another electrode group located on another side of the separation portion ROP.

According to an embodiment, the display device 10 may include the first electrode RME1 and the second electrode RME2 disposed in each subpixel PXn. The first electrode RME1 and the second electrode RME2 may extend in the first direction DR1 on the via layer VIA and may be spaced apart from each other in the second direction DR2. The first electrode RME1 and the second electrode RME2 may have the same width, but the disclosure is not limited thereto.

Each of the first electrode RME1 and the second electrode RME2 may be a first type electrode electrically connected to the fourth conductive layer disposed thereunder. The first electrode RME1 may be directly and electrically connected to the fourth conductive layer through a first electrode contact hole CTD formed in a portion overlapping the first bank BNL1, and the second electrode RME2 may be directly connected to the fourth conductive layer through a second electrode contact hole CTS formed in the subarea SA. The first electrode RME1 may electrically contact the first conductive pattern CDP through the first electrode contact hole CTD penetrating the via layer VIA disposed under the first electrode RME1. The second electrode RME2 may electrically contact the second voltage wiring VL2 through the second electrode contact hole CTS penetrating the via layer VIA disposed under the second electrode RME2. The first electrode RME1 may be electrically connected to the first transistor T1 through the first conductive pattern CDP to receive the first power supply voltage, and the second electrode RME2 may be electrically connected to the second voltage wiring VL2 to receive the second power supply voltage. Since the first electrode RME1 and the second electrode RME2 are disposed separately for each subpixel PXn, the light emitting elements ED of different subpixels PXn may emit light individually.

Although two electrodes RME are disposed in each subpixel PXn in the drawings, but the disclosure is not limited thereto. In some embodiments, the display device 10 may include a larger number of electrodes, and at least some of the electrodes may not be directly connected to the fourth conductive layer.

The electrodes RME may be electrically connected to the light emitting elements ED. The electrodes RME may be electrically connected to both ends of the light emitting elements ED through the connection electrodes CNE and may transmit electrical signals received from the fourth conductive layer to the light emitting elements ED. Electrical signals for causing the light emitting elements ED to emit light may be directly transmitted to the first electrode RME1 and the second electrode RME2. In an embodiment in which electrodes other than the first electrode RME1 and the second electrode RME2 are further included, the electrical signals may be transmitted to the electrodes through the connection electrodes CNE and the light emitting elements ED.

Each electrode RME may include a conductive material having high reflectivity. For example, each electrode RME may include a metal such as silver (Ag), copper (Cu) or aluminum (Al) as a material having high reflectivity or may be an alloy including aluminum (Al), nickel (Ni), or lanthanum (La). Each electrode RME may reflect light, which travels toward a side surface of the first bank BNL1 or a second bank BNL2 (see FIG. 25) after being emitted from the light emitting elements ED, toward above each subpixel PXn.

However, the disclosure is not limited thereto, and each electrode RME may further include a transparent conductive material. For example, each electrode RME may include a material such as ITO, IZO, or ITZO. In some embodiments, each electrode RME may have a structure in which at least one transparent conductive material and at least one metal layer having high reflectivity are each stacked or may be formed as a single layer including them. For example, each electrode RME may have a stacked structure of ITO/Ag/ITO, ITO/Ag/IZO, or ITO/Ag/ITZO/IZO.

A first insulating layer PAS1 may be disposed on the via layer VIA and the electrodes RME. The first insulating layer PAS1 may be disposed to entirely cover or overlap the electrodes RME and may protect the electrodes RME while insulating them from each other. The first insulating layer PAS1 may prevent the light emitting elements ED disposed on the first insulating layer PAS1 from being damaged by directly contacting other members.

In an embodiment, the first insulating layer PAS1 may have a step structure (or height differences) such that a portion of an upper surface of the first insulating layer PAS1 is recessed between the electrodes RME spaced apart from each other in the second direction DR2. The light emitting elements ED may be disposed on the recessed upper surface of the first insulating layer PAS1, and a space may be formed between each of the light emitting elements ED and the first insulating layer PAS1. However, the disclosure is not limited thereto.

The first insulating layer PAS1 may include contact portions (e.g., a first contact portion CT1 and a third contact portion CT3) partially exposing upper surfaces of the electrodes RME, respectively. The contact portions may penetrate the first insulating layer PAS1, and the connection electrodes CNE to be described below may electrically contact the electrodes RME exposed through the contact portions.

The first bank BNL1 may be disposed on the first insulating layer PAS1. The first bank BNL1 may include portions extending in the first direction DR1 and the second direction DR2 to form a lattice pattern in a plan view. The first bank BNL1 may be disposed at the boundary of each subpixel PXn to separate neighboring subpixels PXn from each other. The first bank BNL1 may surround the emission area EMA and the subarea SA disposed in each subpixel PXn to separate them from each other.

The first bank BNL1 may have a predetermined height and prevent ink from overflowing to adjacent subpixels PXn in an inkjet printing process during the manufacturing process of the display device 10. The first bank BNL1 may prevent inks in which different light emitting elements ED are dispersed for different subpixels PXn from being mixed with each other.

The light emitting elements ED may be disposed on the first insulating layer PAS1. Each light emitting element ED may include layers disposed in a direction parallel to an upper surface of the first substrate SUB. The direction in which the light emitting elements ED of the display device 10 extend may be parallel to the first substrate SUB, and semiconductor layers included in each light emitting element ED may be sequentially arranged in the direction parallel to the upper surface of the first substrate SUB. However, the disclosure is not limited thereto. In some embodiments, in case that the light emitting elements ED have a different structure, the layers may be arranged in a direction perpendicular to the first substrate SUB.

The light emitting elements ED may be spaced apart from each other in the first direction DR1 in which each electrode RME extends and may be aligned substantially parallel to each other. The light emitting elements ED may extend in a direction, and the direction in which each electrode RME extends and the direction in which the light emitting elements ED extend may be substantially perpendicular to each other. However, the disclosure is not limited thereto, and the light emitting elements ED may also extend obliquely to the direction in which each electrode RME extends.

Each light emitting element ED may include semiconductor layers doped with impurities of different conductivity types, and both ends of the light emitting elements ED may electrically contact connection electrodes CNE1 to CNE4 described below. An insulating film 38 (see FIG. 6) may not be formed on end surfaces of each light emitting element ED in the extending direction of the light emitting element ED, thereby partially exposing the semiconductor layers. The exposed semiconductor layers may contact the connection electrodes CNE. Each light emitting element ED may be electrically connected to an electrode RME through a connection electrode CNE and may emit light of a specific wavelength band.

The light emitting elements ED disposed in each subpixel PXn may emit light of different wavelength bands depending on the materials that form the semiconductor layers. However, the disclosure is not limited thereto, and the light emitting elements ED disposed in each subpixel PXn may also emit light of the same color. Since each light emitting element ED may include the semiconductor layers doped with impurities of different conductivity types, it may be oriented such that an end of the light emitting element ED faces a specific direction by an electric field generated on the electrodes RME.

According to an embodiment, the display device 10 may include light emitting elements ED (e.g., ED1 and ED2) disposed on different layers. The display device 10 may include first light emitting elements ED1 disposed on the first insulating layer PAS1 and second light emitting elements ED2 disposed on a second insulating layer PAS2 disposed on the first light emitting elements ED1. The first light emitting elements ED1 and the second light emitting elements ED2 may be electrically connected to the electrodes RME1 and RME2 through the connection electrodes CNE disposed on different layers. In the display device 10, since the light emitting elements ED are disposed on different layers, they may be stacked in the thickness direction, and the number of light emitting elements ED disposed per unit area may increase.

The first light emitting elements ED1 may be directly disposed on the first insulating layer PAS1, and both ends of each first light emitting element ED1 may be disposed on the first electrode RME1 and the second electrode RME2. A length of each first light emitting element ED1 may be greater than a gap between the first electrode RME1 and the second electrode RME2.

The second insulating layer PAS2 may be disposed on the first light emitting elements ED1. The second insulating layer PAS2 may be entirely disposed on the first insulating layer PAS1 and may overlap the first light emitting elements ED1 and the first bank BNL1 disposed on the first insulating layer PAS1. The second insulating layer PAS2 may overlap the connection electrodes CNE1 and CNE2 of a first connection electrode layer CNL1 described below and may protect the connection electrodes CNE1 and CNE2 while insulating them from each other. The second insulating layer PAS2 may insulate the first light emitting elements ED1 from other light emitting elements ED and connection electrodes CNE disposed on the second insulating layer PAS2.

The second insulating layer PAS2 may include a contact portion (e.g., a second contact portion CT2) partially exposing an upper surface of the first connection electrode layer CNL1 disposed thereunder and a contact portion (e.g., the third contact portion CT3) partially exposing the upper surfaces of the electrodes RME as well as the first insulating layer PAS1. Some of contact portions may penetrate the second insulating layer PAS2, and connection electrodes CNE of a second connection electrode layer CNL2 described below may electrically contact the connection electrodes CNE of the first connection electrode layer CNL1 or the electrodes RME through the contact portions formed in the second insulating layer PAS2.

The second light emitting elements ED2 may be directly disposed on the second insulating layer PAS2. Similar to the first light emitting elements ED1, the second light emitting elements ED2 may be disposed such that both ends are on the first electrode RME1 and the second electrode RME2. A length of each second light emitting element ED2 may be greater than the gap between the first electrode RME1 and the second electrode RME2.

According to an embodiment, at least some of the first light emitting elements ED1 may overlap the second light emitting elements ED2 in the third direction DR3, which is the thickness direction. The second light emitting elements ED2 may be disposed on the second insulating layer PAS2 overlapping the first light emitting elements ED1. In the manufacturing process of the display device 10, the light emitting elements ED may be oriented such that an end of the light emitting element ED faces a specific direction by an electric field generated by the electrodes RME. The light emitting elements ED may be oriented such that both ends of the light emitting element ED are on the electrodes RME. The first light emitting elements ED1 and the second light emitting elements ED2 may be oriented by an electric field generated by the same electrode RME. Since the second insulating layer PAS2 is disposed on the first light emitting elements ED1, the second light emitting elements ED2 may be oriented according to an electric field generated by the electrodes RME regardless of the positions of the first light emitting elements ED1 disposed under the second light emitting elements ED2. The display device 10 may include the light emitting elements ED disposed on different layers, and at least some of the light emitting elements ED may overlap each other in the thickness direction.

Each light emitting element ED may include semiconductor layers, and a first end and a second end opposite the first end may be defined with respect to a semiconductor layer. Each light emitting element ED may be disposed such that each of the first end and the second end is on a specific electrode RME, and the first ends of the light emitting elements ED1 and ED2 disposed on different layers may be on different electrodes RME. According to an embodiment, a direction in which the first ends of the first light emitting elements ED1 face may be opposite to a direction in which the first ends of the second light emitting elements ED2 face. For example, the first light emitting elements ED1 may be disposed such that the first ends are on the first electrode RME1 and the second ends are on the second electrode RME2. In contrast, the second light emitting elements ED2 may be disposed such that the first ends are on the second electrode RME2 and the second ends are on the first electrode RME1. However, the disclosure is not limited thereto, and the light emitting elements ED may also be disposed such that only one end of each light emitting element ED is on an electrode RME1 or RME2 according to the direction in which the light emitting elements ED are oriented between the first electrode RME1 and the second electrode RME2.

Connection electrodes CNE may be disposed on the first light emitting elements ED1 and the second light emitting elements ED2. The connection electrodes CNE may include the connection electrodes CNE1 and CNE2 of the first connection electrode layer CNL1 disposed on the first light emitting elements ED1 and disposed between the first insulating layer PAS1 and the second insulating layer PAS2 and the connection electrodes CNE3 and CNE4 of the second connection electrode layer CNL2 disposed on the second light emitting elements ED2 and the second insulating layer PAS2. The first connection electrode layer CNL1 may include a first connection electrode CNE1 and a second connection electrode CNE2 disposed on the first light emitting elements ED1, and the second connection electrode layer CNL2 may include a third connection electrode CNE3 and a fourth connection electrode CNE4 disposed on the second light emitting elements ED2.

Each of the connection electrodes CNE may include a portion extending in the first direction DR1 across the emission area EMA and the subarea SA. The first connection electrode CNE1 of the first connection electrode layer CNL1 and the third connection electrode CNE3 of the second connection electrode layer CNL2 may be disposed on the first electrode RME1 to extend in the first direction DR1, and the second connection electrode CNE2 of the first connection electrode layer CNL1 and the fourth connection electrode CNE4 of the second connection electrode layer CNL2 may be disposed on the second electrode RME2 to extend in the first direction DR1. The connection electrodes CNE may be disposed on the first bank BNL1 disposed between the emission area EMA and the subarea SA. The connection electrodes CNE may form linear patterns in each subpixel PXn. Similar to the electrodes RME, connection electrodes CNE disposed on the same layer may be spaced apart from each other in the second direction DR2. The first connection electrode CNE1 and the second connection electrode CNE2 may be spaced apart from each other in the second direction DR2 on the first light emitting elements ED1, and the third connection electrode CNE3 and the fourth connection electrode CNE4 may be spaced apart from each other in the second direction DR2 on the second light emitting elements ED2.

In the drawings, the connection electrodes CNE may be directly disposed on the light emitting elements ED, and the connection electrodes CNE of the same connection electrode layer CNL1 or CNL2 may be formed on substantially the same layer. However, the disclosure is not limited thereto. In some embodiments, another insulating layer may be further disposed between the light emitting elements ED and the connection electrodes CNE and between the connection electrodes CNE so that some of the connection electrodes CNE are disposed on the same layer and the others are disposed on different layers.

A portion of each connection electrode CNE disposed in the emission area EMA may electrically contact the light emitting elements ED. For example, the first connection electrode CNE1 and the second connection electrode CNE2 of the first connection electrode layer CNL1 may electrically contact the first ends and the second ends of the first light emitting elements ED1, respectively. The third connection electrode CNE3 and the fourth connection electrode CNE4 of the second connection electrode layer CNL2 may electrically contact the first ends and the second ends of the second light emitting elements ED2, respectively.

According to an embodiment, the connection electrodes CNE of the display device 10 may be divided into different types of connection electrodes electrically connected to the electrodes RME or other connection electrodes CNE. For example, the connection electrodes CNE may include the first connection electrode CNE1 and the third connection electrode CNE3 as first type connection electrodes directly connected to the electrodes RME through contact portions formed in the first insulating layer PAS1. The connection electrodes CNE may include the second connection electrode CNE2 and the fourth connection electrode CNE4 as second type connection electrodes directly connected to other connection electrodes CNE through a contact portion formed in the second insulating layer PAS2.

The first connection electrode CNE1 may be disposed on the first insulating layer PAS1 to overlap the first electrode RME1. The first connection electrode CNE1 may electrically contact the first electrode RME1 through the first contact portion CT1 penetrating the first insulating layer PAS1 to expose an upper surface of the first electrode RME1.

The third connection electrode CNE3 may be disposed on the second insulating layer PAS2 to overlap the first electrode RME1 and the first connection electrode CNE1. In an embodiment, the third connection electrode CNE3 may include an electrode extension portion CP extending in the second direction DR2 in the subarea SA. The electrode extension portion CP may be electrically connected to a portion of the third connection electrode CNE3 which extends in the first direction DR1 and thus may be disposed across the first electrode RME1 and the second electrode RME2. The electrode extension portion CP may electrically contact the second electrode RME2 through the third contact portion CT3 which penetrates the first insulating layer PAS1 and the second insulating layer PAS2 in a portion overlapping the second electrode RME2 to expose an upper surface of the second electrode RME2.

Each of the first connection electrode CNE1 and the third connection electrode CNE3 which are first type connection electrodes may transmit an electrical signal transmitted to an electrode RME to one end of each of light emitting elements ED. The first connection electrode CNE1 may electrically contact the first ends of the first light emitting elements ED1 to transmit an electrical signal received from the first electrode RME1 to the first ends of the first light emitting elements ED1. The third connection electrode CNE3 may electrically contact the second ends of the second light emitting elements ED2 to transmit an electrical signal received from the second electrode RME2 to the second ends of the second light emitting elements ED2. The electrical signals may be directly transmitted to the first ends of the first light emitting elements ED1 and the second ends of the second light emitting elements ED2 and may be transmitted to other connection electrodes CNE and light emitting elements ED through the second ends of the first light emitting elements ED1 and the first ends of the second light emitting elements ED2.

The second connection electrode CNE2 may be disposed on the first insulating layer PAS1 to overlap the second electrode RME2. The fourth connection electrode CNE4 may be disposed on the second insulating layer PAS2 to overlap the second electrode RME2 and the second connection electrode CNE2. The second connection electrode CNE2 and the fourth connection electrode CNE4 may be electrically connected to each other through the second contact portion CT2 penetrating the second insulating layer PAS2.

Each of the second connection electrode CNE2 and the fourth connection electrode CNE4, which are second type connection electrodes, may transmit an electrical signal transmitted to light emitting elements ED to an end of each of other light emitting elements ED. The second connection electrode CNE2 may electrically contact the second ends of the first light emitting elements ED1, and the fourth connection electrode CNE4 may electrically contact the first ends of the second light emitting elements ED2. Electrical signals transmitted from first type connection electrodes to the first light emitting elements ED1 and the second light emitting elements ED2 may flow through the second connection electrode CNE2 and the fourth connection electrode CNE4, and the first light emitting elements ED1 and the second light emitting elements ED2 may be electrically connected to each other through the second type connection electrodes. Light emitting elements ED disposed in a subpixel PXn may be electrically connected in series to each other through second type connection electrodes.

In order for the light emitting elements ED disposed on different layers to be electrically connected in series to each other, the second ends of the first light emitting elements ED1 may be electrically connected to the first ends of the second light emitting elements ED2. Since the direction in which the first ends of the second light emitting elements ED2 face is opposite to the direction in which the first ends of the first light emitting elements ED1 face, even if the connection electrodes disposed in different connection electrode layers CNL1 and CNL2 are electrically connected to each other while overlapping in the thickness direction, the second ends of the first light emitting elements ED1 may be electrically connected to the first ends of the second light emitting elements ED2. For example, the second ends of the first light emitting elements ED1 may electrically contact the second connection electrode CNE2, and the first ends of the second light emitting elements ED2 may electrically contact the fourth connection electrode CNE4. Even if the second connection electrode CNE2 and the fourth connection electrode CNE4 overlap each other in the thickness direction with the second insulating layer PAS2 interposed therebetween, since the second light emitting elements ED2 and the first light emitting elements ED1 are oriented in different directions, the second connection electrode CNE2 and the fourth connection electrode CNE4 may electrically contact different ends of the light emitting elements ED. Accordingly, the connection electrode CNE of the second connection electrode layer CNL2 may electrically connect the light emitting elements ED in series even without including a separate bypass wiring or an extension portion for connection with the connection electrode CNE which electrically contacts the second ends of the first light emitting elements ED1.

The contact portions CT1 to CT3 may not overlap the light emitting elements ED in the second direction DR2. Each of the contact portions CT1 to CT3 may be spaced apart in the first direction DR1 from an area where the light emitting elements ED are disposed. In an embodiment, the contact portions CT1 to CT3 may be formed in the subarea SA where the light emitting elements ED are not disposed. Since the contact portions CT1 to CT3 are disposed in the subarea SA, it is possible to minimize or reduce light emitted from the light emitting elements ED but refracted by the contact portions CT1 to CT3 and thus failing to be emitted to the outside. In addition, it is possible to prevent the light emitting elements ED from clustering around the contact portions CT1 to CT3 in the manufacturing process of the display device 10 because of the contact portions CT1 to CT3 exposing the upper surfaces of the electrodes RME.

The connection electrodes CNE may include a conductive material such as ITO, IZO, ITZO, or aluminum (Al). For example, the connection electrodes CNE may include a transparent conductive material, and light emitted from the light emitting elements ED may pass through the connection electrodes CNE and proceed toward the electrodes RME, but the disclosure is not limited thereto.

Although not illustrated in the drawings, another insulating layer may be further disposed on the connection electrodes CNE to cover or overlap them. The insulating layer may be entirely disposed on the first substrate SUB to protect the members disposed on the first substrate SUB from the external environment.

Each of the first insulating layer PAS1 and the second insulating layer PAS2 may include, but is not limited to, an inorganic insulating material or an organic insulating material.

According to an embodiment, the second insulating layer PAS2 disposed on the first light emitting elements ED1 may be made of a transparent insulating material. The display device 10 may include light emitting elements ED (e.g., ED1 and ED2) stacked in the thickness direction, and the second insulating layer PAS2 may be disposed between them. The second insulating layer PAS2 may be made of a transparent material so that light emitted from the first light emitting elements ED1 is emitted toward above the via layer VIA.

The display device 10 according to the embodiment may include a large number of light emitting elements ED per unit area by including the light emitting elements ED (e.g., ED1 and ED2) disposed on different layers. The light emitting elements ED (e.g., ED1 and ED2) disposed on different layers may be electrically connected in series to each other through connection electrodes CNE, thereby improving the luminance of each subpixel PXn.

Figure 6:
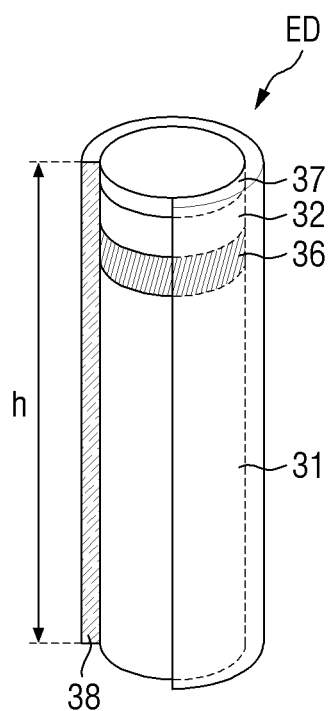
FIG. 6 is a schematic view of a light emitting element according to an embodiment.

FIG. 6 is a schematic view of a light emitting element ED according to an embodiment.

Referring to FIG. 6, the light emitting element ED may be a light emitting diode. Specifically, the light emitting element ED may be an inorganic light emitting diode having a size of nanometers to micrometers and made of an inorganic material. In case that an electric field is formed in a specific direction between two electrodes facing each other, the light emitting element ED may be aligned between the two electrodes in which polarities are formed.

The light emitting element ED according to the embodiment may extend in a direction. The light emitting element ED may be shaped like a cylinder, a rod, a wire, a tube, or the like. However, the shape of the light emitting element ED is not limited thereto, and the light emitting element ED may have various shapes including polygonal prisms, such as a cube, a rectangular parallelepiped, and a hexagonal prism, and a shape extending in a direction and having a partially inclined outer surface.

The light emitting element ED may include a semiconductor layer doped with impurities of any conductivity type (e.g., p type or n type). The semiconductor layer may receive an electrical signal from an external power source and emit light of a specific wavelength band. The light emitting element ED may include a first semiconductor layer 31, a second semiconductor layer 32, a light emitting layer 36, an electrode layer 37, and the insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be one or more of AlGaInN, GaN, AlGaN, InGaN, AlN, and InN doped with an n-type dopant. An n-type dopant used to dope the first semiconductor layer 31 may be Si, Ge, Sn, or the like. The first end of the light emitting element ED may be a portion in which the first semiconductor layer 31 is disposed with respect to the light emitting layer 36.

The second semiconductor layer 32 may be disposed on the first semiconductor layer 31 with the light emitting layer 36 interposed therebetween. The second semiconductor layer 32 may be a p-type semiconductor. The second semiconductor layer 32 may include a semiconductor material having a chemical formula of $Al_xGa_yIn_{1-x-y}N$ ($0 \le x \le 1$, $0 \le y \le 1$, $0 \le x+y \le 1$). For example, the second semiconductor layer 32 may be one or more of AlGaInN, GaN, AlGaN, InGaN, AlN, and InN doped with a p-type dopant. A p-type dopant used to dope the second semiconductor layer 32 may be Mg, Zn, Ca, Se, Ba, or the like. The second end of the light emitting element ED may be a portion in which the second semiconductor layer 32 is disposed with respect to the light emitting layer 36.

Although each of the first semiconductor layer 31 and the second semiconductor layer 32 is composed of a single layer in the drawing, the disclosure is not limited thereto. Each of the first semiconductor layer 31 and the second semiconductor layer 32 may also include a larger number of layers, for example, may further include a clad layer or a tensile strain barrier reducing (TSBR) layer, depending on the material of the light emitting layer 36.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, it may have a structure in which quantum layers and well layers are alternately stacked. The light emitting layer 36 may emit light by the coupling of electron-hole pairs according to electrical signals received through the first semiconductor layer 31 and the second semiconductor layer 32. The light emitting layer 36 may include a material such as AlGaN or AlGaInN. In case that the light emitting layer 36 has a multiple quantum well structure in which a quantum layer and a well layer are alternately stacked, the quantum layer may include a material such as AlGaN or AlGaInN, and the well layer may include a material such as GaN or AlInN.

The light emitting layer 36 may also have a structure in which a semiconductor material having a large band gap energy and a semiconductor material having a small band gap energy are alternately stacked or may include different group III to V semiconductor materials depending on the wavelength band of light emitted from the light emitting layer 36. Light emitted from the light emitting layer 36 is not limited to light in a blue wavelength band. In some cases, the light emitting layer 36 may emit light in a red or green wavelength band.

The electrode layer 37 may be an ohmic connection electrode. However, the disclosure is not limited thereto, and the electrode layer 37 may also be a Schottky connection electrode. The light emitting element ED may include at least one electrode layer 37. The light emitting element ED may include one or more electrode layers 37. However, the disclosure is not limited thereto, and the electrode layer 37 may also be omitted.

In case that the light emitting element ED is electrically connected to an electrode or a connection electrode in the display device 10, the electrode layer 37 may reduce the resistance between the light emitting element ED and the electrode or the connection electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium tin zinc oxide (ITZO).

The insulating film 38 surrounds outer surfaces of the semiconductor layers and the electrode layers described above. For example, the insulating film 38 may surround an outer surface of at least the light emitting layer 36 but may expose both ends of the light emitting element ED in a longitudinal direction. An upper surface of the insulating film 38 may be rounded in an area adjacent to at least one end of the light emitting element ED in a cross-sectional view.

The insulating film 38 may include a material having insulating properties, such as silicon oxide ($SiO_x$), silicon nitride ($SiN_x$), silicon oxynitride ($SiO_xN_y$), aluminum nitride (AlN), or aluminum oxide ($AlO_x$). Although the insulating film 38 is illustrated as a single layer in the drawing, the disclosure is not limited thereto. In some embodiments, the insulating film 38 may be formed in a multilayer structure in which layers are stacked.

The insulating film 38 may protect the above members. The insulating film 38 may prevent an electrical short circuit that may occur in the light emitting layer 36 in case that the light emitting layer 36 directly contacts an electrode through which an electrical signal is transmitted to the light emitting element ED. The insulating film 38 may prevent a reduction in luminous efficiency of the light emitting element ED.

An outer surface of the insulating film 38 may be treated. Light emitting elements ED may be sprayed onto electrodes in a state where they are dispersed in a predetermined ink and then may be aligned. Here, the surface of the insulating film 38 may be hydrophobically or hydrophilically treated so that each light emitting element ED remains separate from other adjacent light emitting elements ED in the ink without agglomerating with them.

The process of manufacturing the display device 10 will now be described with further reference to other drawings.

FIGS. 7 to 12 are schematic cross-sectional views sequentially illustrating a process of manufacturing a display device 10 according to an embodiment. Hereinafter, the order of forming each layer will be described, and a method of forming each layer will be briefly described.

Figure 7:
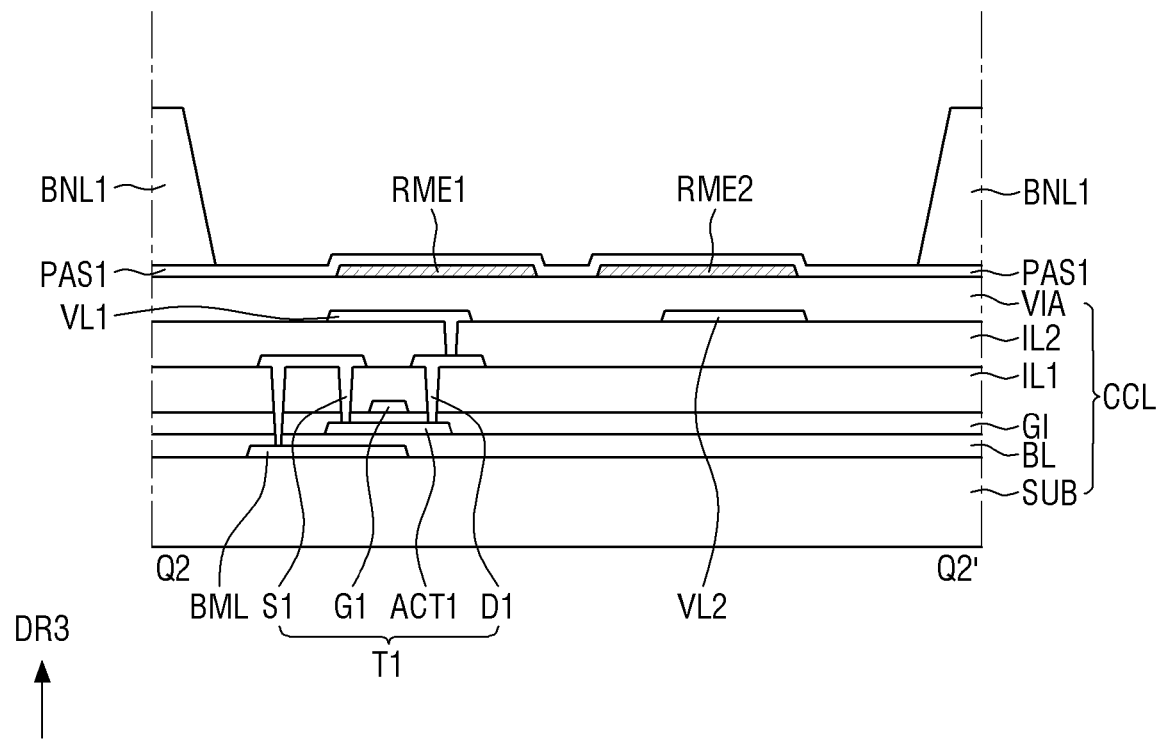
FIGS. 7 through 12 are schematic cross-sectional views sequentially illustrating a process of manufacturing a display device according to an embodiment.

First, referring to FIG. 7, a first substrate SUB may be prepared, and a circuit layer CCL, electrodes RME, a first insulating layer PAS1, and a first bank BNL1 may be formed on the first substrate SUB. The structure of each layer may be the same as that described above.

Figure 8:
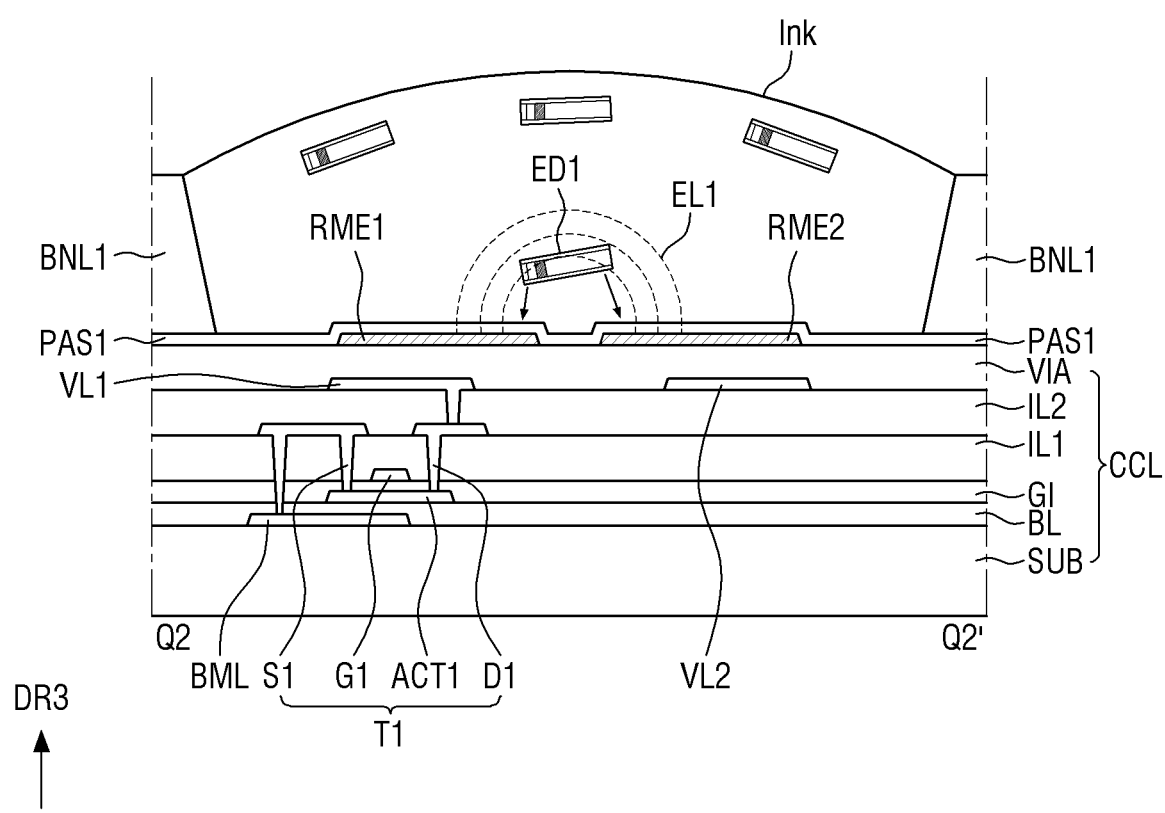

Next, referring to FIG. 8, first light emitting elements ED1 may be placed on the first insulating layer PAS1.

In the display device 10 according to the embodiment, light emitting elements ED may be placed on the electrodes RME by an inkjet printing process. Each light emitting element ED including semiconductor layers doped with different conductivity types may have an intramolecular dipole and may be placed on the electrodes RME by receiving a dielectrophoretic force due to an electric field in ink Ink.

The ink Ink sprayed onto each subpixel PXn may settle in an emission area EMA surrounded by the first bank BNL1. The first bank BNL1 may prevent the ink Ink from overflowing to other adjacent emission areas EMA. Therefore, even if inks Ink including different types of light emitting elements ED are sprayed onto different subpixels PXn, they may be prevented from being mixed with each other.

After the first insulating layer PAS1 is formed, the ink Ink in which the first light emitting elements ED1 are dispersed may be sprayed onto the emission area EMA of each subpixel PXn. In case that the ink Ink settles in the emission area EMA, a first electric field EL1 may be generated by transmitting electrical signals to electrodes RME1 and RME2. The first electric field EL1 may orient the first light emitting elements ED1 such that both ends of each first light emitting element ED1 face specific directions. First ends of the first light emitting elements ED1 may be placed on the first electrode RME1 by the first electric field EL1.

Figure 9:
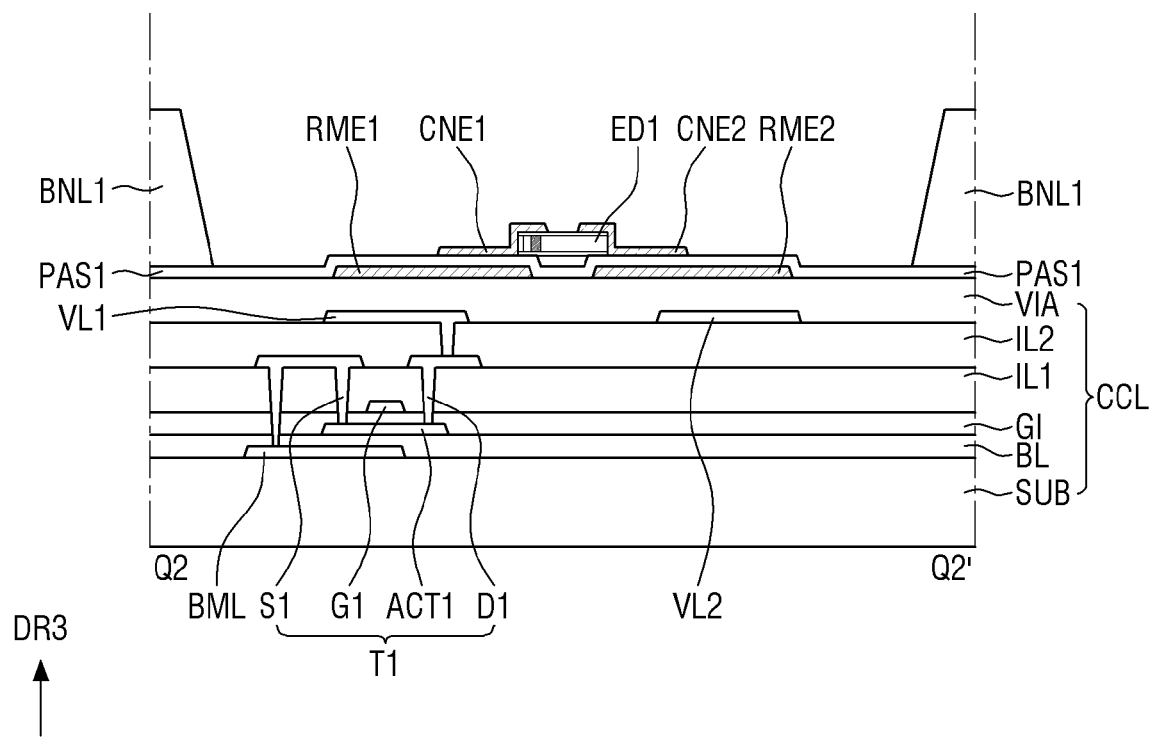

Referring to FIG. 9, a first connection electrode CNE1 and a second connection electrode CNE2 may be formed on the first light emitting elements ED1. In some embodiments, the first connection electrode CNE1 and the second connection electrode CNE2 may be formed by a patterning process of partially separating a layer disposed to overlap the first light emitting elements ED1. The first connection electrode CNE1 and the second connection electrode CNE2 may be disposed on the first light emitting elements ED1 and the first insulating layer PAS1 to form a first connection electrode layer CNL1. For example, the first and second connection electrodes CNE1 and CNE2 may be in a same layer.

Figure 10:
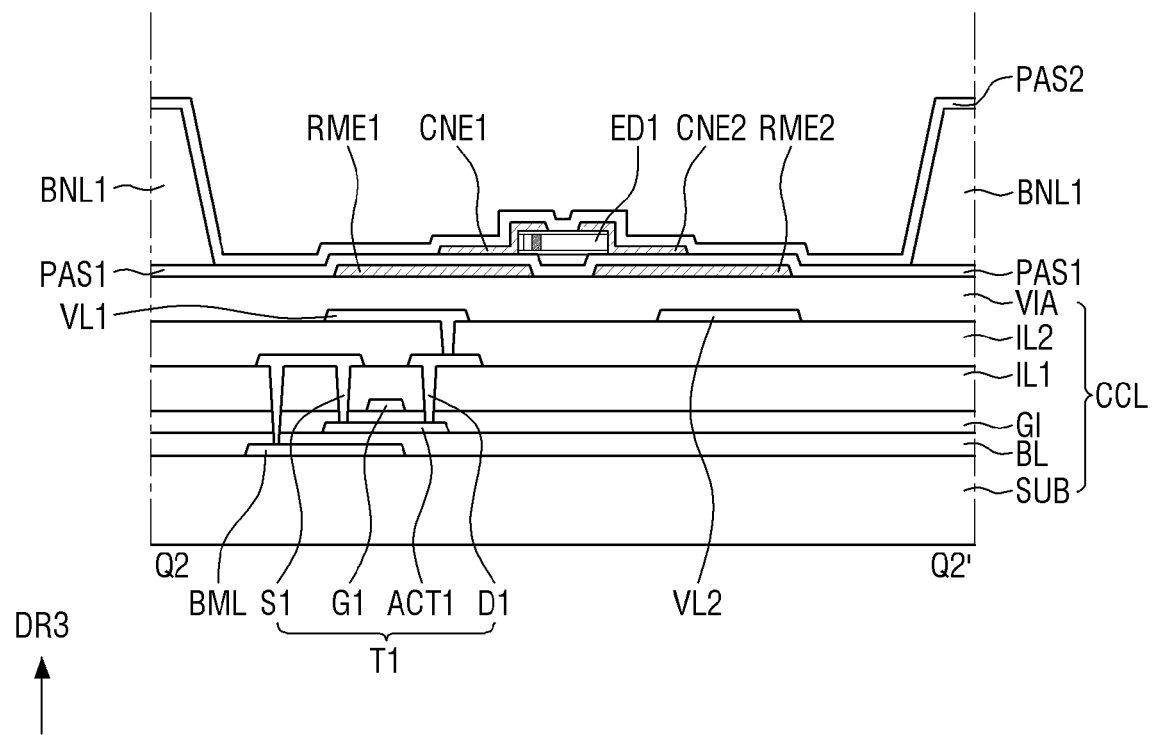

Referring to FIG. 10, a second insulating layer PAS2 may be disposed on the first light emitting elements ED1 and the first connection electrode layer CNL1. The second insulating layer PAS2 may be entirely disposed on the first insulating layer PAS1 and may overlap the first light emitting elements ED1, the first connection electrode layer CNL1, and the first bank BNL1.

Figure 11:
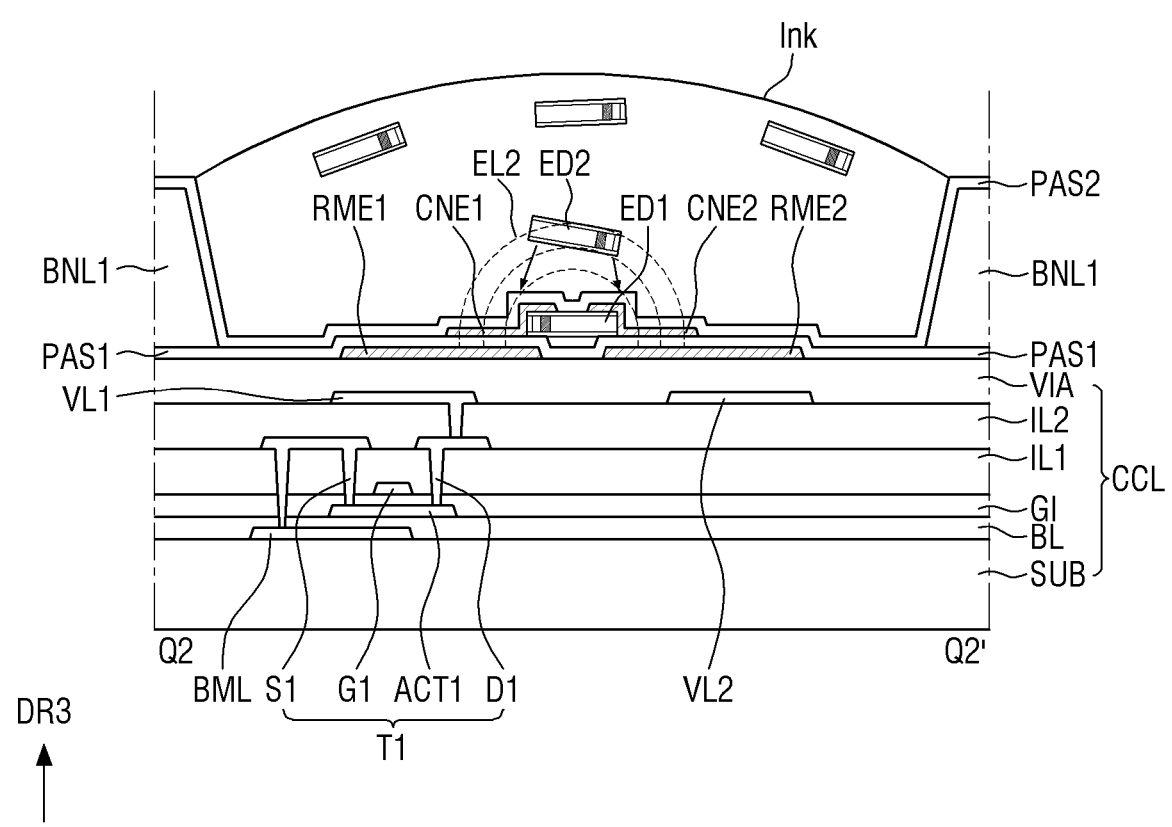

Referring to FIG. 11, second light emitting elements ED2 may be placed on the second insulating layer PAS2. The second light emitting elements ED2 may also be sprayed onto the emission area EMA surrounded by the first bank BNL1 in a state where they are dispersed in ink Ink. In case that the ink Ink is sprayed onto the emission area EMA, a second electric field EL2 may be generated by transmitting electrical signals to the electrodes RME1 and RME2. According to an embodiment, the direction of the second electric field EL2 generated in case that the second light emitting elements ED2 are placed in the manufacturing process of the display device 10 may be opposite to the direction of the first electric field EL1 for placing the first light emitting elements ED1. The electrical signals transmitted to the first electrode RME1 and the second electrode RME2 to generate the second electric field EL2 may be opposite to the electrical signals transmitted to the electrodes RME1 and RME2 to generate the first electric field EL1. For example, the first electric field EL1 is generated by transmitting a first signal to the first electrode RME1 and transmitting a second signal to the second electrode RME2, and the second electric field EL2 may be formed by transmitting the second signal to the first electrode RME1 and transmitting the first signal to the second electrode RME2. The second electric field EL2 may orient the second light emitting elements ED2 such that both ends of each second light emitting element ED2 face directions opposite to the directions in which both ends of each first light emitting element ED1 face. First ends of the second light emitting elements ED2 may be placed on the second electrode RME2 by the second electric field EL2. As described above, the first light emitting elements ED1 and the second light emitting elements ED2 may be oriented such that their first ends face opposite directions. Even if connection electrodes CNE disposed on different layers are electrically connected to each other while overlapping in the thickness direction, the first light emitting elements ED1 and the second light emitting elements ED2 may be electrically connected in series to each other.

Figure 12:
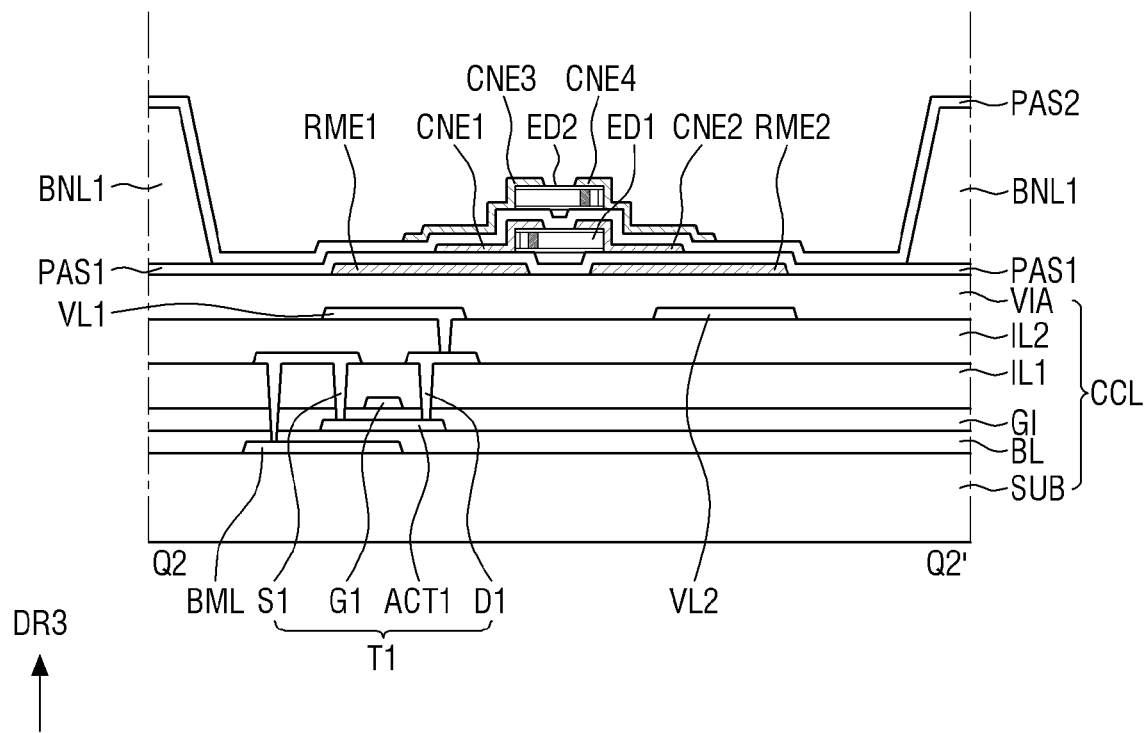

Referring to FIG. 12, a third connection electrode CNE3 and a fourth connection electrode CNE4 may be formed on the second light emitting elements ED2. In some embodiments, the third connection electrode CNE3 and the fourth connection electrode CNE4 may be formed by a patterning process of partially separating a layer disposed to overlap the second light emitting elements ED2. The third connection electrode CNE3 and the fourth connection electrode CNE4 may be disposed on the second light emitting elements ED2 and the second insulating layer PAS2 to form a second connection electrode layer CNL2. For example, the third and fourth connection electrodes CNE3 and CNE4 may be in a same layer.

The display device 10 according to the embodiment may be manufactured by the above process. The display device 10 may include the light emitting elements ED (e.g., ED1 and ED2) disposed on different layers, and the light emitting elements ED may be electrically connected in series to each other through the connection electrodes CNE disposed on different layers. Since the display device 10 includes the light emitting elements ED stacked in the thickness direction, the number of light emitting elements ED disposed per unit area may be increased, and the luminance of each subpixel PXn can be improved by connecting the light emitting elements ED in series.

Various embodiments of the display device 10 will now be described with further reference to other drawings.

Figure 13:
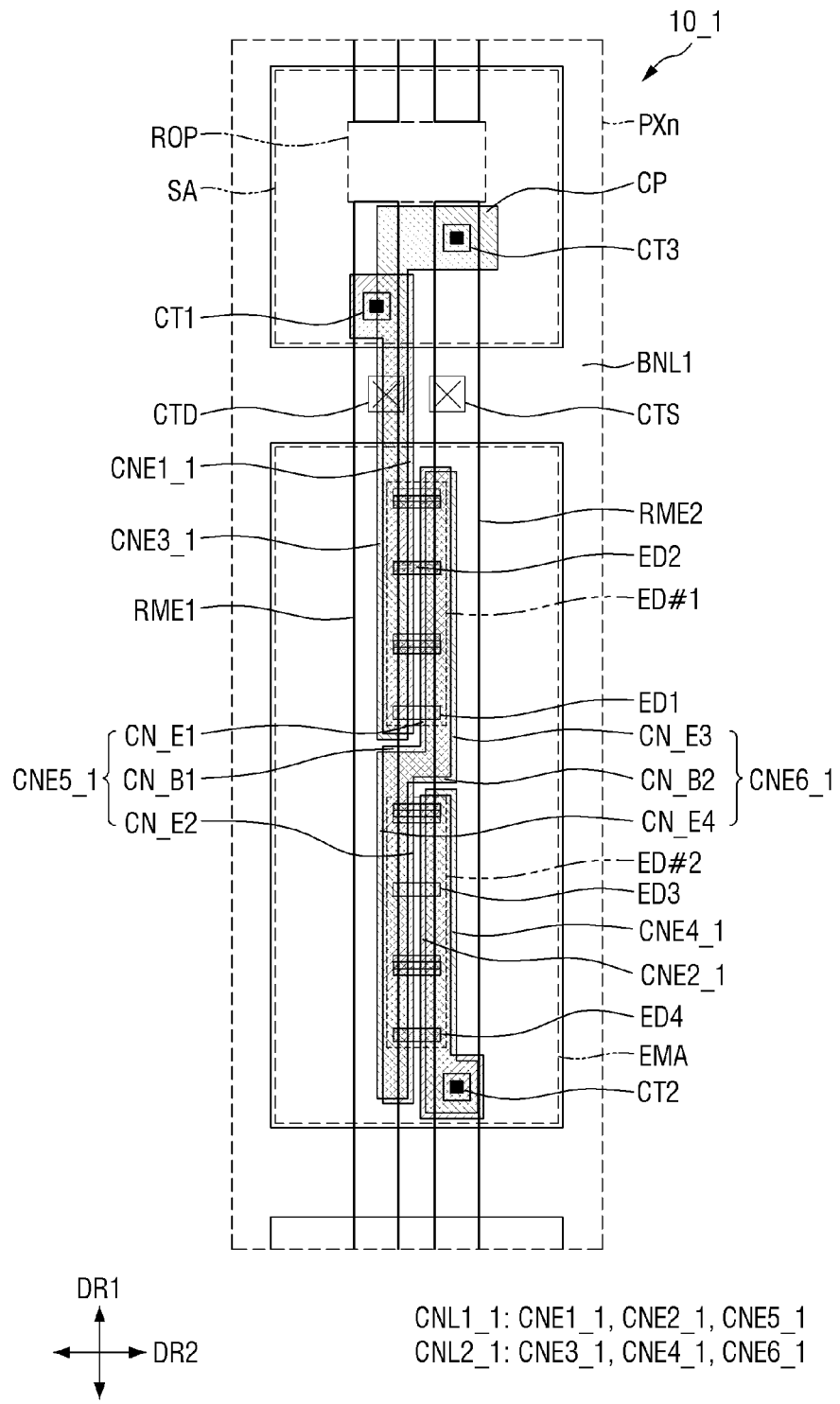
FIG. 13 is a schematic plan view of a subpixel of a display device according to an embodiment.

FIG. 13 is a schematic plan view of a subpixel PXn of a display device 10_1 according to an embodiment.

Referring to FIG. 13, in the display device 10_1 according to the embodiment, connection electrode layers CNL (e.g., CNL1 and CNL2) disposed in each subpixel PXn may include a larger number of connection electrodes CNE. Of light emitting elements ED disposed in a subpixel PXn, light emitting elements ED disposed on the same layer may also be electrically connected in series to each other. This embodiment may be different from the embodiment of FIG. 3 at least in that a larger number of connection electrodes CNE are disposed in each subpixel PXn.

The display device 10_1 may include first light emitting elements ED1 disposed on a first insulating layer PAS1 and may further include third light emitting elements ED3 spaced apart from the first light emitting elements ED1 in the first direction DR1. The display device 10_1 may include second light emitting elements ED2 disposed on a second insulating layer PAS2 and may further include fourth light emitting elements ED4 spaced apart from the second light emitting elements ED2 in the first direction DR1. The first light emitting elements ED1 and the second light emitting elements ED2 may form a first light emitting element group ED #1, and the third light emitting elements ED3 and the fourth light emitting elements ED4 may form a second light emitting element group ED #2. At least some of the first light emitting elements ED1 may overlap the second light emitting elements ED2 in the thickness direction but may not overlap the fourth light emitting elements ED4. At least some of the third light emitting elements ED3 may overlap the fourth light emitting elements ED4 in the thickness direction but may not overlap the second light emitting elements ED2. The light emitting elements ED of the first light emitting element group ED #1 and the second light emitting element group ED #2 may be divided into light emitting elements ED disposed adjacent to each other in an area of an emission area EMA. The light emitting elements ED of the first light emitting element group ED #1 may be spaced apart from the light emitting elements ED of the second light emitting element group ED #2 in the first direction DR1.

The light emitting elements ED (e.g., ED1 to ED4) may be disposed such that both ends thereof are on a first electrode RME1 and a second electrode RME2. First ends of the first light emitting elements ED1 and the third light emitting elements ED3 may be on the electrode RME1, and second ends thereof may be on the second electrode RME2. In contrast, first ends of the second light emitting elements ED2 and the fourth light emitting elements ED4 may be on the second electrode RME2, and second ends thereof may be on the first electrode RME1.

A first connection electrode layer CNL1_1 may include a first connection electrode CNE1_1 and a second connection electrode CNE2_1 and may further include a fifth connection electrode CNE5_1. The first connection electrode CNE1_1 may be disposed on the first electrode RME1 to electrically contact the first ends of the first light emitting elements ED1. The second connection electrode CNE2_1 may be disposed on the second electrode RME2 to electrically contact the second ends of the third light emitting elements ED3. The fifth connection electrode CNE5_1 may be disposed over the first electrode RME1 and the second electrode RME2. The fifth connection electrode CNE5_1 may include a first extending portion CN_E1 disposed on the second electrode RME2 and spaced apart from the first connection electrode CNE1_1 in the second direction DR2, a second extending portion CN_E2 disposed on the first electrode RME1 and spaced apart from the second connection electrode CNE2_1 in the second direction DR2, and a first connecting portion CN_B1 electrically connecting the first extending portion CN_E1 and the second extending portion CN_E2. The first extending portion CN_E1 may be spaced apart from the second connection electrode CNE2_1 in the first direction DR1, and the second extending portion CN_E2 may be spaced apart from the first connection electrode CNE1_1 in the first direction DR1. The first connecting portion CN_B1 may extend in the second direction DR2 in a central portion of the emission area EMA and may be disposed over the first electrode RME1 and the second electrode RME2. The first light emitting elements ED1 and the third light emitting elements ED3 may be electrically connected in series to each other through the fifth connection electrode CNE5_1.

A second connection electrode layer CNL2_1 may include a third connection electrode CNE3_1 and a fourth connection electrode CNE4_1 and may further include a sixth connection electrode CNE6_1. The third connection electrode CNE3_1 may be disposed on the first electrode RME1 and the first connection electrode CNE1_1 to electrically contact the first ends of the second light emitting elements ED2. The fourth connection electrode CNE4_1 may be disposed on the second electrode RME2 and the second connection electrode CNE2_1 to electrically contact the second ends of the fourth light emitting elements ED4. The sixth connection electrode CNE6_1 may be disposed over the second electrode RME2 and the first electrode RME1 to overlap the fifth connection electrode CNE5_1. The sixth connection electrode CNE6_1 may include a third extending portion CN_E3 disposed on the first extending portion CN_E1 of the fifth connection electrode CNE5_1 and spaced apart from the third connection electrode CNE3_1 in the second direction DR2, a fourth extending portion CN_E4 disposed on the second extending portion CN_E2 of the fifth connection electrode CNE5_1 and spaced apart from the fourth connection electrode CNE4_1 in the second direction DR2, and a second connecting portion CN_B2 electrically connecting the third extending portion CN_E3 and the fourth extending portion CN_E4. The third extending portion CN_E3 may be spaced apart from the fourth connection electrode CNE4_1 in the first direction DR1, and the fourth extending portion CN_E4 may be spaced apart from the third connection electrode CNE3_1 in the first direction DR1. The second connecting portion CN_B2 may extend in the second direction DR2 in the central portion of the emission area EMA and may be disposed over the first electrode RME1 and the second electrode RME2 to overlap the first connecting portion CN_B1. The second light emitting elements ED2 and the fourth light emitting elements ED4 may be electrically connected in series to each other through the sixth connection electrode CNE6_1.

The second connection electrode CNE2_1 and the fourth connection electrode CNE4_1 may be electrically connected to each other through a second contact portion CT2 penetrating the second insulating layer PAS2 in the emission area EMA. The third light emitting elements ED3 may be electrically connected in series to the fourth light emitting elements ED4. For example, in the display device 10_1, the light emitting elements ED of each subpixel PXn may form a four-stage series connection.

In the display device 10_1 according to the embodiment, light emitting elements ED disposed on the same layer may be divided into different light emitting element groups ED #1 and ED #2 and may be electrically connected in series to each other through the connection electrodes CNE. In the display device 10_1, not only the light emitting elements ED disposed on different layers but also the light emitting elements ED disposed on the same layer may be electrically connected in series to each other through the connection electrodes CNE, and thus luminance per unit area can be improved.

Figure 14:
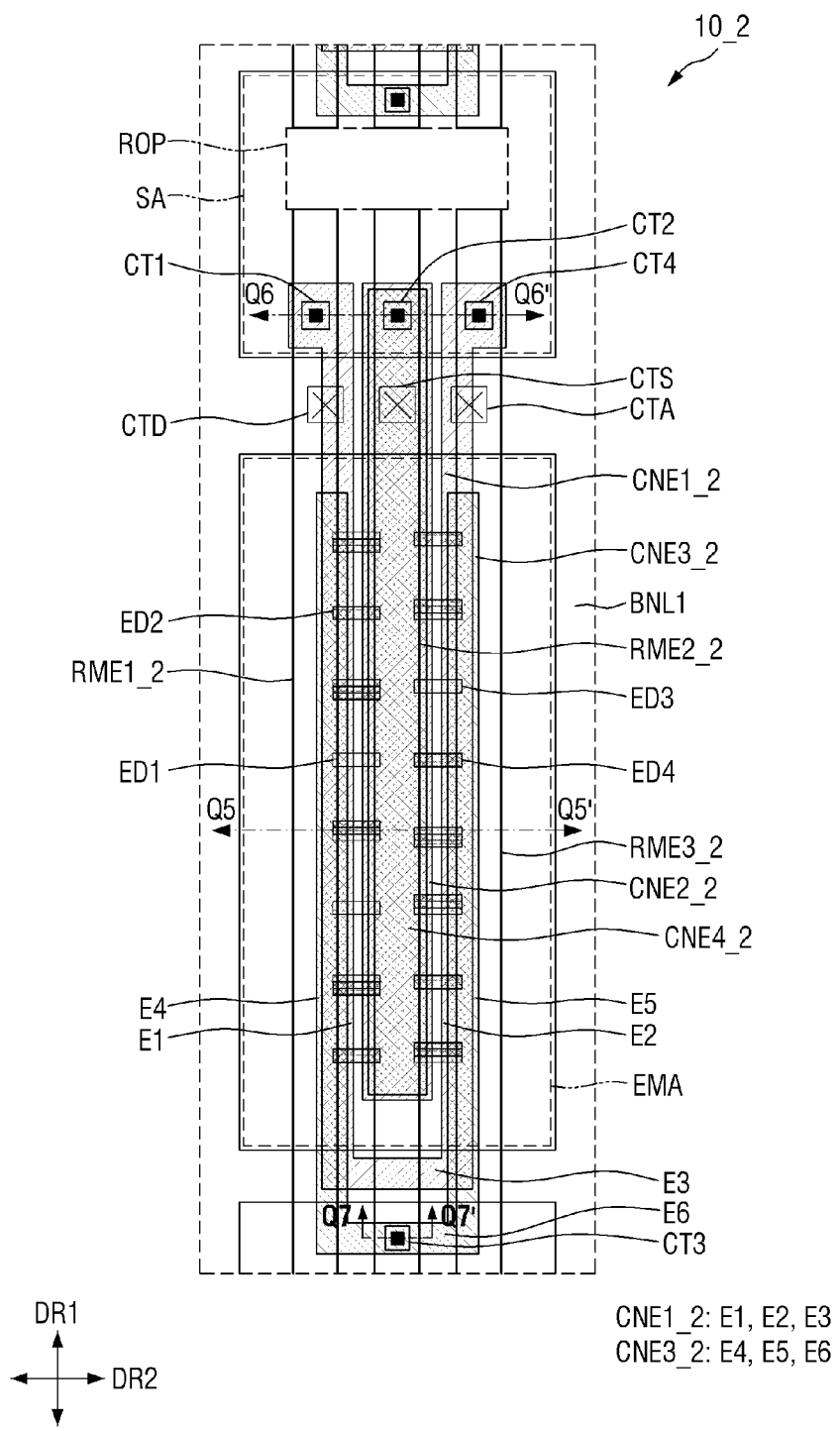
FIG. 14 is a schematic plan view of a subpixel of a display device according to an embodiment.
Figure 15:
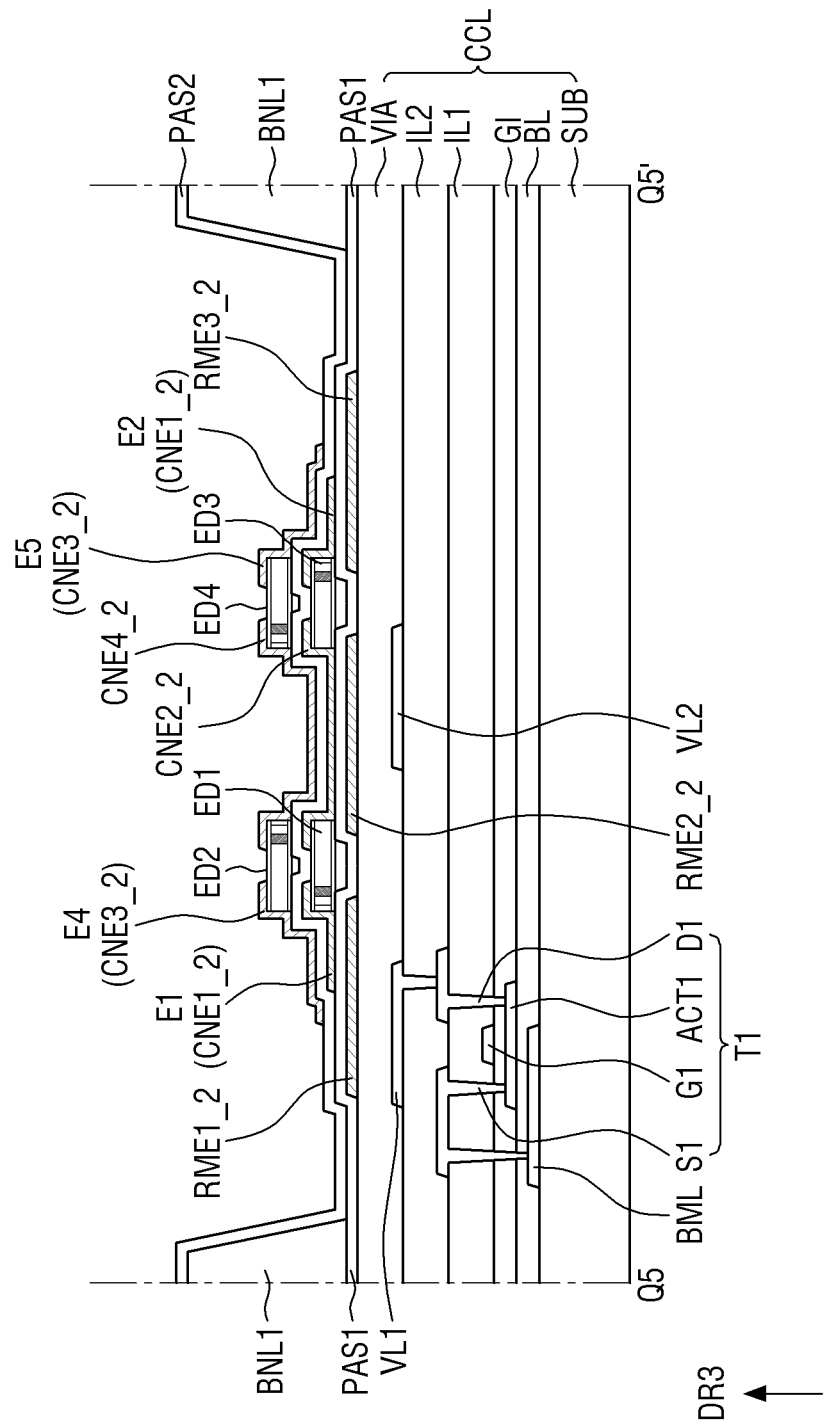
FIG. 15 is a schematic cross-sectional view taken along line Q5-Q5' of FIG. 14.
Figure 16:
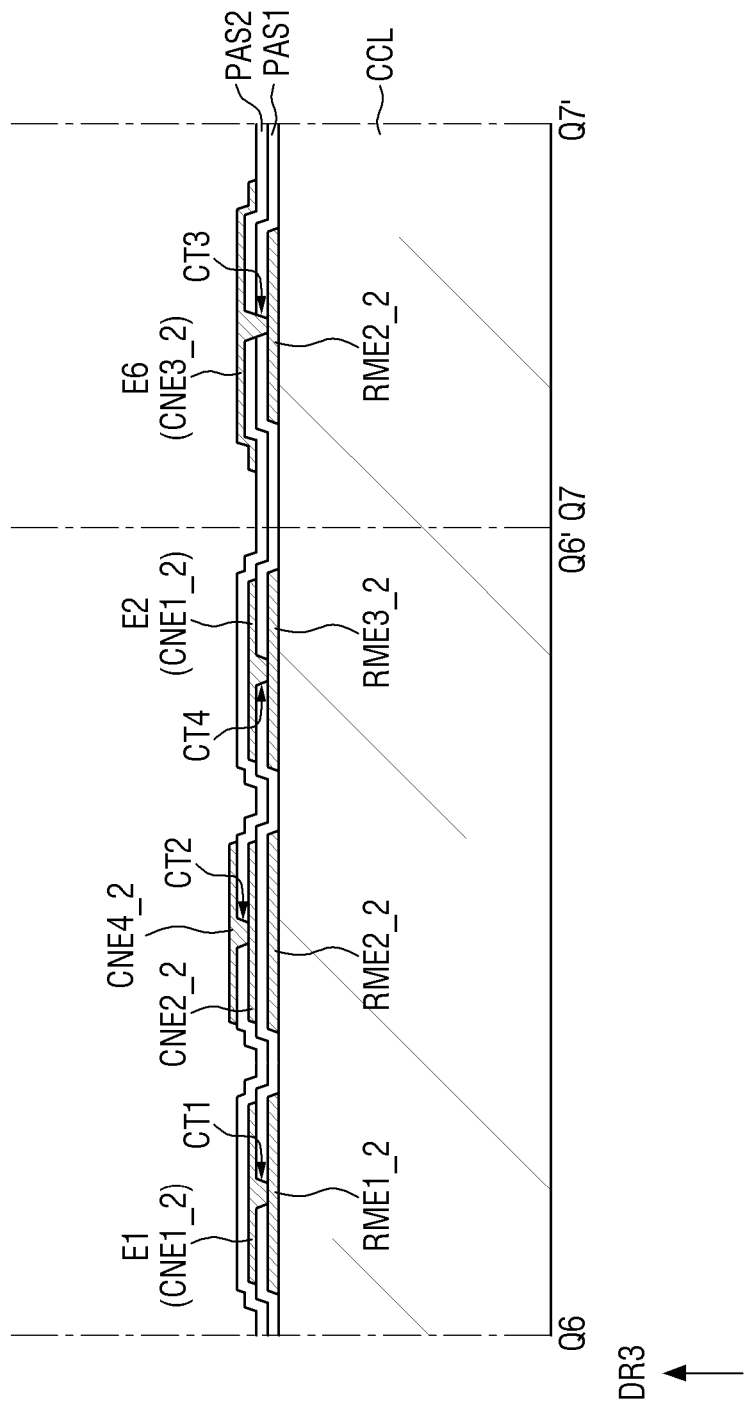
FIG. 16 is a schematic cross-sectional view taken along lines Q6-Q6' and Q7-Q7' of FIG. 14.

FIG. 14 is a schematic plan view of a subpixel PXn of a display device 10_2 according to an embodiment. FIG. 15 is a schematic cross-sectional view taken along line Q5-Q5' of FIG. 14. FIG. 16 is a schematic cross-sectional view taken along lines Q6-Q6' and Q7-Q7' of FIG. 14.

Referring to FIGS. 14 to 16, in the display device 10_2 according to the embodiment, a larger number of electrodes RME (e.g., RME1_2 to RME3_2) may be disposed in each subpixel PXn. A larger number of light emitting elements ED may be disposed in each subpixel PXn, and the light emitting elements ED disposed in a subpixel PXn may be electrically connected in series or parallel to each other. The display device 10_2 according to the embodiment may be different from the embodiment of FIG. 3 at least in the number of electrodes RME and light emitting elements ED disposed in a subpixel PXn.

The display device 10_2 may further include a third electrode RME3_2 in addition to a first electrode RME1_2 and a second electrode RME2_2. The third electrode RME3_2 may be spaced apart from the first electrode RME1_2 in the second direction DR2 with the second electrode RME2_2 interposed therebetween. The third electrode RME3_2 may also be spaced apart from the second electrode RME2_2 in the second direction DR2 to face the second electrode RME2_2. Similar to the first electrode RME1_2, the third electrode RME3_2 may extend in the first direction DR1 across an emission area EMA and a subarea SA and may be separated in a separation portion ROP from the third electrode RME3_2 of another subpixel PXn neighboring in the first direction DR1.

The third electrode RME3_2 may be electrically connected to a fourth conductive layer through a third electrode contact hole CTA penetrating a via layer VIA disposed under the third electrode RME3_2. Similar to the first electrode RME1_2, the third electrode RME3_2 may be electrically connected to a conductive pattern CDP of the fourth conductive layer and may receive an electrical signal from a first transistor T1. In case that the display device 10_2 is driven, signals may be simultaneously transmitted to the first electrode RME1_2 and the third electrode RME3_2 in each subpixel PXn.

Light emitting elements ED may be disposed on the first electrode RME1_2 and the second electrode RME22 and on the second electrode RME2_2 and the third electrode RME3_2. The light emitting elements ED may include first light emitting elements ED1 and may further include third light emitting elements ED3 disposed on a first insulating layer PAS1 and disposed on the second electrode RME2_2 and the third electrode RME3_2. The light emitting elements ED may include second light emitting elements ED2 and may further include fourth light emitting elements ED4 disposed on a second insulating layer PAS2 and disposed on the second electrode RME2_2 and the third electrode RME3_2.

The third light emitting elements ED3 and the fourth light emitting elements ED4 may be disposed such that both ends are on the second electrode RME2_2 and the third electrode RME3_2. First ends of the third light emitting elements ED3 may be disposed on the third electrode RME3_2, and second ends of the third light emitting elements ED3 may be disposed on the second electrode RME2_2. In contrast, first ends of the fourth light emitting elements ED4 may be disposed on the second electrode RME2_2, and second ends of the fourth light emitting elements ED4 may be disposed on the third electrode RME3_2. For example, the first ends of the third light emitting elements ED3 may face the same direction as first ends of the second light emitting elements ED2 faces, and the first ends of the fourth light emitting elements ED4 may face the same direction as first ends of the first light emitting elements ED1 faces.

According to an embodiment, each of a first connection electrode CNE1_2 and a third connection electrode CNE3_2 may be disposed on the first electrode RME1_2 and the third electrode RME3_2.

The first connection electrode CNE1_2 may include a first portion E1 disposed on the first electrode RME1_2 to electrically contact the first ends of the first light emitting elements ED1, a second portion E2 disposed on the third electrode RME3_2 to electrically contact the first ends of the third light emitting elements ED3, and a third portion E3 electrically connecting the first portion E1 and the second portion E2. The third portion E3 may be disposed on a first bank BNL1 located on a second side of the emission area EMA in the first direction DR1 and may extend in the second direction DR2. However, the disclosure is not limited thereto, and the third portion E3 may also be disposed in the emission area EMA. The first connection electrode CNE1_2 may partially surround an outer surface of a second connection electrode CNE2_2 in a plan view.

The first portion E1 and the second portion E2 of the first connection electrode CNE1_2 may be disposed over the emission area EMA and the subarea SA. Of the first portion E1, a portion disposed in the emission area EMA may electrically contact the first light emitting elements ED1, and a portion disposed in the subarea SA may electrically contact the first electrode RME1_2 through a first contact portion CT1 penetrating the first insulating layer PAS1. Of the second portion E2, a portion disposed in the emission area EMA may electrically contact the third light emitting elements ED3, and a portion disposed in the subarea SA may electrically contact the third electrode RME3_2 through a fourth contact portion CT4 penetrating the first insulating layer PAS1. The first light emitting elements ED1 and the third light emitting elements ED3 may respectively be electrically connected to the first electrode RME1_2 and the third electrode RME3_2 through the first connection electrode CNE1_2.

The third connection electrode CNE3_2 may include a fourth portion E4 disposed on the first electrode RME1_2 and the first portion E1 of the first connection electrode CNE1_2 to electrically contact second ends of the second light emitting elements ED2, a fifth portion E5 disposed on the third electrode RME3_2 and the second portion E2 of the first connection electrode CNE1_2 to electrically contact second ends of the fourth light emitting elements ED4, and a sixth portion E6 electrically connecting the fourth portion E4 and the fifth portion E5. The sixth portion E6 may extend in the second direction DR2 in the subarea SA of another subpixel PXn neighboring in the first direction DR1. However, the disclosure is not limited thereto, and the sixth portion E6 may be disposed in the emission area EMA. The third connection electrode CNE3_2 may partially surround an outer surface of a fourth connection electrode CNE4_2 in a plan view.

The fourth portion E4 and the fifth portion E5 of the third connection electrode CNE3_2 may be disposed over the emission area EMA and the subarea SA of another subpixel PXn. A portion of the fourth portion E4 which is disposed in the emission area EMA may electrically contact the second light emitting elements ED2, and a portion of the fifth portion E5 which is disposed in the emission area EMA may electrically contact the fourth light emitting elements ED4. The sixth portion E6 of the third connection electrode CNE3_2 may electrically contact the second electrode RME2_2 through a third contact portion CT3 penetrating the first insulating layer PAS1 and the second insulating layer PAS2 disposed under the sixth portion E6. The second light emitting elements ED2 and the fourth light emitting elements ED4 may be electrically connected to the second electrode RME2_2 through the third connection electrode CNE3_2.

The second connection electrode CNE2_2 may be disposed on the second electrode RME2_2 and may electrically contact second ends of the first light emitting elements ED1 and the second ends of the third light emitting elements ED3. The second connection electrode CNE2_2 may be wider than the first portion E1 of the first connection electrode CNE1_2 and the second electrode RME2_2. The second connection electrode CNE2_2 may simultaneously contact the first light emitting elements ED1 and the third light emitting elements ED3 disposed on the first insulating layer PAS1.

The fourth connection electrode CNE4_2 may be disposed on the second electrode RME2_2 and the second connection electrode CNE2_2 and may electrically contact the first ends of the second light emitting elements ED2 and the first ends of the fourth light emitting elements ED4. The fourth connection electrode CNE4_2 may be wider than the fourth portion E4 of the third connection electrode CNE3_2 and the second electrode RME2_2. The fourth connection electrode CNE4_2 may simultaneously contact the second light emitting elements ED2 and the fourth light emitting elements ED4 disposed on the second insulating layer PAS2.

The second connection electrode CNE2_2 and the fourth connection electrode CNE4_2 may be disposed over the emission area EMA and the subarea SA and may be electrically connected to each other through a second contact portion CT2 penetrating the second insulating layer PAS2 in the subarea SA. The first light emitting elements ED1 and the third light emitting elements ED3 may be electrically connected in series to the second light emitting elements ED2 and the fourth light emitting elements ED4 through the second connection electrode CNE2_2 and the fourth connection electrode CNE4_2, respectively. The first light emitting elements ED1 and the third light emitting elements ED3 may respectively receive electrical signals from the first electrode RME1_2 and the third electrode RME3_2 through the first connection electrode CNE1_2, and the second light emitting elements ED2 and the fourth light emitting elements ED4 may receive an electrical signal from the second electrode RME2_2 through the third connection electrode CNE3_2. For example, the first light emitting elements ED1 and the second light emitting elements ED2 may be electrically connected in parallel to the third light emitting elements ED3 and the fourth light emitting elements ED4, and the first light emitting elements ED1 and the third light emitting elements ED3 may be electrically connected in series to the second light emitting elements ED2 and the fourth light emitting elements ED4. Since the display device 10_2 according to the embodiment further includes the third electrode RME3_2, light emitting elements ED may form a two-stage series-two-stage parallel connection.

Figure 17:
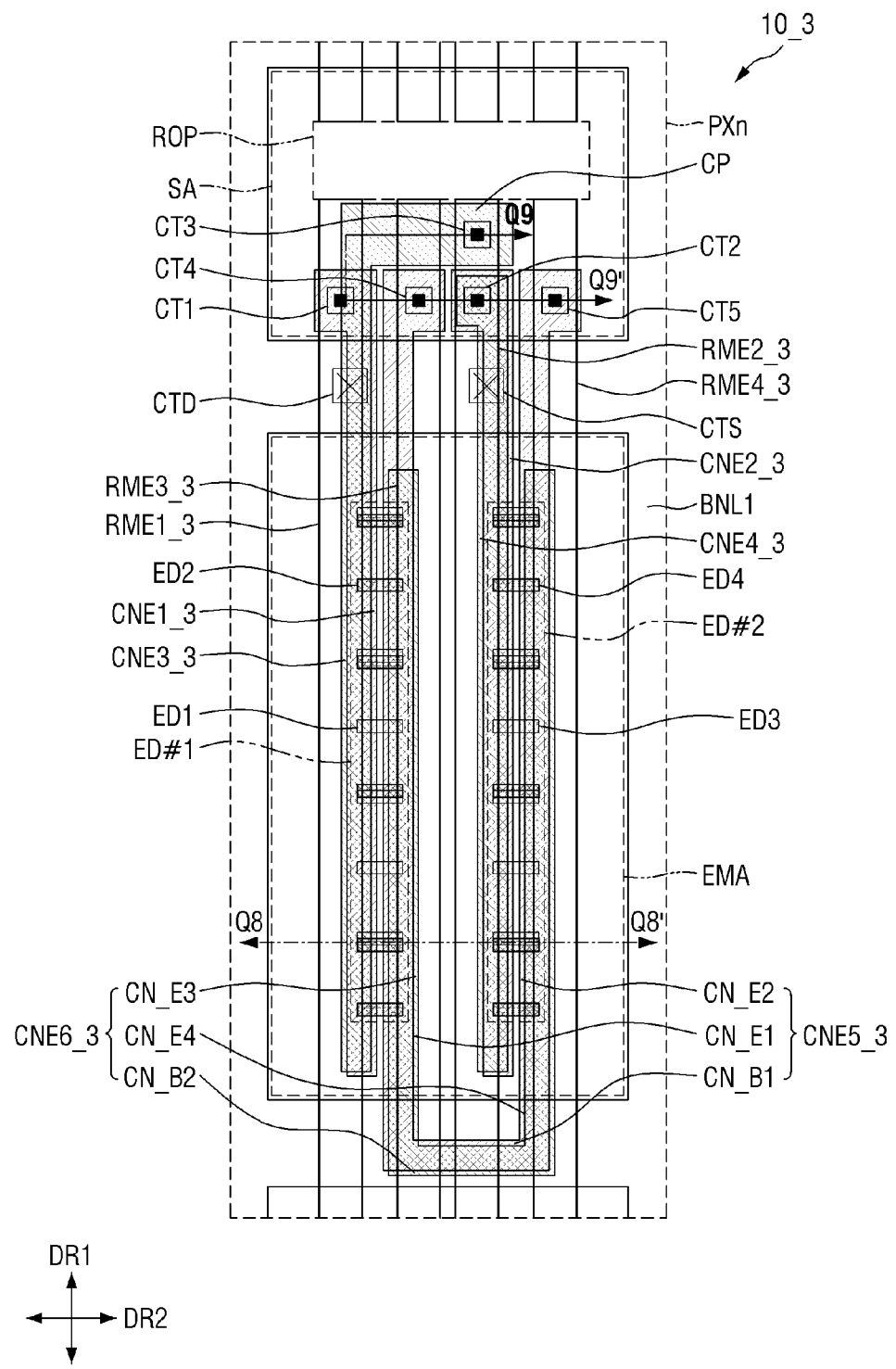
FIG. 17 is a schematic plan view of a subpixel of a display device according to an embodiment.
Figure 18:
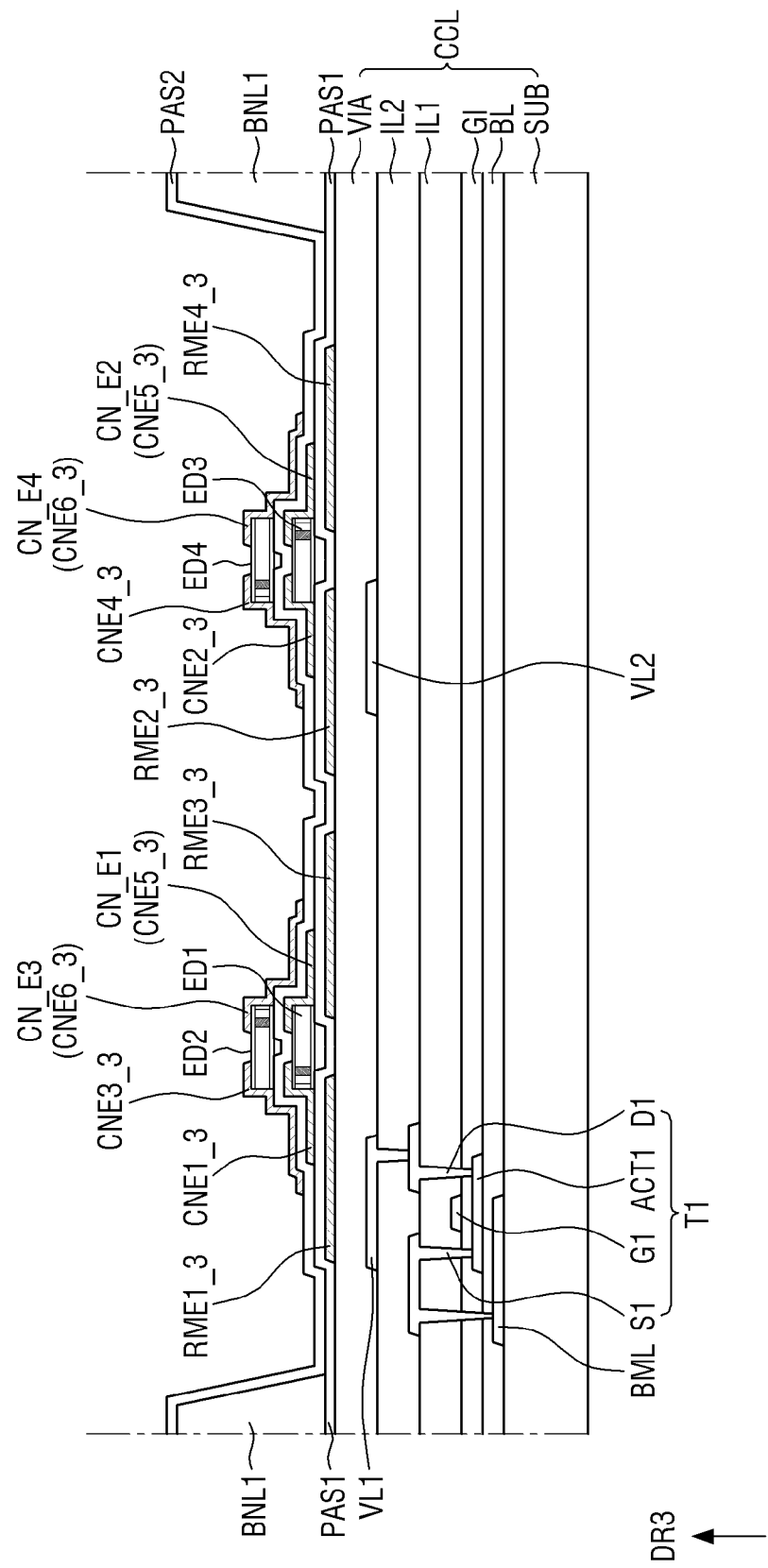
FIG. 18 is a schematic cross-sectional view taken along line Q8-Q8' of FIG. 17.
Figure 19:
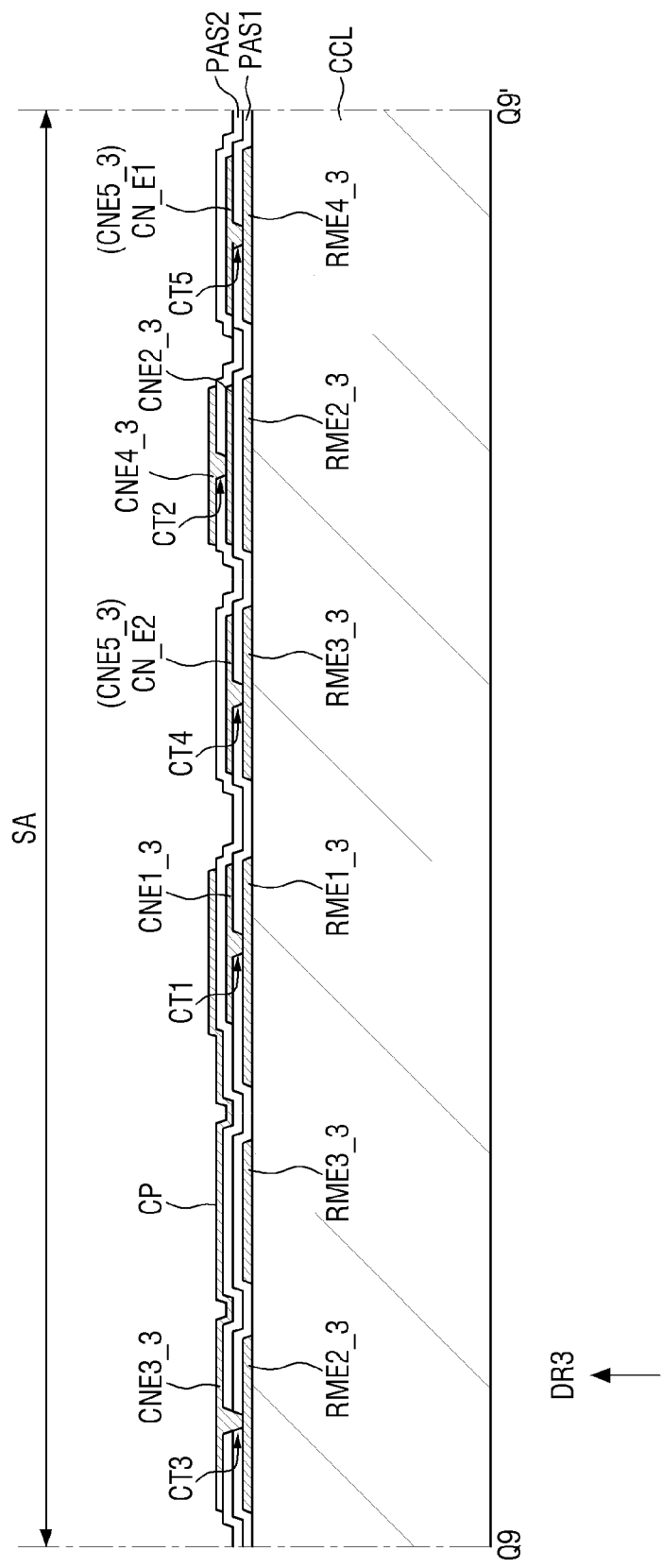
FIG. 19 is a schematic cross-sectional view taken along line Q9-Q9' of FIG. 17.

FIG. 17 is a schematic plan view of a subpixel PXn of a display device 10_3 according to an embodiment. FIG. 18 is a schematic cross-sectional view taken along line Q8-Q8' of FIG. 17. FIG. 19 is a schematic cross-sectional view taken along line Q9-Q9' of FIG. 17.

Referring to FIGS. 17 to 19, the display device 10_3 according to the embodiment may include a larger number of electrodes RME and connection electrodes CNE in each subpixel PXn. The number of series connections of light emitting elements ED disposed in a subpixel PXn may increase. In the display device 10_3 according to the embodiment, the light emitting elements ED of each subpixel PXn may form a four-stage series connection, thereby improving luminance per unit area.

The display device 10_3 may further include a third electrode RME3_3 and a fourth electrode RME4_3 in addition to a first electrode RME1_3 and a second electrode RME23. The third electrode RME3_3 may be disposed between the first electrode RME1_3 and the second electrode RME2_3, and the fourth electrode RME4_3 may be spaced apart from the third electrode RME3_3 in the second direction DR2 with the second electrode RME2_3 interposed therebetween. The third electrode RME3_3 may be spaced apart from the first electrode RME1_3 in the second direction DR2 to face the first electrode RME1_3, and the fourth electrode RME4_3 may be spaced apart from the second electrode RME2_3 in the second direction DR2 to face the second electrode RME2_3. Similar to the first electrode RME1_3 and the second electrode RME2_3, the third electrode RME3_3 and the fourth electrode RME4_3 may extend in the first direction DR1 across an emission area EMA and a subarea SA and may be separated in a separation portion ROP from the third electrode RME3_3 and the fourth electrode RME4_3 of another neighboring subpixel PXn in the first direction DR1. However, the third electrode RME3_3 and the fourth electrode RME4_3 may not be directly connected to a fourth conductive layer disposed under a via layer VIA. The first electrode RME1_3 and the second electrode RME2_3 may be first type electrodes which are directly connected to the fourth conductive layer, and the third electrode RME3_3 and the fourth electrode RME4_3 may be second type electrodes which are not directly connected to the fourth conductive layer.

Light emitting elements ED may be disposed on the first electrode RME1_3 and the third electrode RME3_3 and on the second electrode RME2_3 and the fourth electrode RME4_3. The light emitting elements ED may include first light emitting elements ED1 which are disposed on a first insulating layer PAS1 and have both ends disposed on the first electrode RME1_3 and the third electrode RME3_3 and third light emitting elements ED3 which are disposed on the first insulating layer PAS1 and have both ends disposed on the second electrode RME2_3 and the fourth electrode RME4_3. The light emitting elements ED may include second light emitting elements ED2 which are disposed on a second insulating layer PAS2 and have both ends disposed on the first electrode RME1_3 and the third electrode RME3_3 and fourth light emitting elements ED4 which are disposed on the second insulating layer PAS2 and have both ends disposed on the second electrode RME2_3 and the fourth electrode RME4_3.

First ends of the first light emitting elements ED1 and the third light emitting elements ED3 may face opposite directions, and first ends of the second light emitting elements ED2 and the fourth light emitting elements ED4 may face opposite directions. In contrast, the first ends of the first light emitting elements ED1 and the fourth light emitting elements ED4 may face the same direction, and the first ends of the second light emitting elements ED2 and the third light emitting elements ED3 may face the same direction.

Connection electrodes CNE of the display device 10_3 may include a first connection electrode CNE1_3 and a second connection electrode CNE2_3 disposed on the first light emitting elements ED1 and the third light emitting elements ED3 and a third connection electrode CNE3_3 and a fourth connection electrode CNE4_3 disposed on the second light emitting elements ED2 and the fourth light emitting elements ED4. The connection electrodes CNE may further include a fifth connection electrode CNE5_3 disposed on the first light emitting elements ED1 and the third light emitting elements ED3 and a sixth connection electrode CNE6_3 disposed on the second light emitting elements ED2 and the fourth light emitting elements ED4.

The first connection electrode CNE1_3 may be disposed on the first insulating layer PAS1 to overlap the first electrode RME1_3 and may electrically contact the first ends of the first light emitting elements ED1. The first connection electrode CNE1_3 may electrically contact the first electrode RME1_3 through a first contact portion CT1 penetrating the first insulating layer PAS1 in the subarea SA. The second connection electrode CNE2_3 may be disposed on the first insulating layer PAS1 to overlap the second electrode RME2_3 and may electrically contact second ends of the third light emitting elements ED3.

The third connection electrode CNE3_3 may be disposed on the second insulating layer PAS2 to overlap the first electrode RME1_3 and the first connection electrode CNE1_3 and may electrically contact second ends of the second light emitting elements ED2. The third connection electrode CNE3_3 may include an electrode extension portion CP extending in the second direction DR2 in the subarea SA and may electrically contact the second electrode RME2_3 through a third contact portion CT3 penetrating the first insulating layer PAS1 and the second insulating layer PAS2. The fourth connection electrode CNE4_3 may be disposed on the second insulating layer PAS2 to overlap the second electrode RME2_3 and the second connection electrode CNE2_3 and may electrically contact the first ends of the fourth light emitting elements ED4. The fourth connection electrode CNE4_3 may electrically contact the second connection electrode CNE2_3 through a second contact portion CT2 penetrating the second insulating layer PAS2 in the subarea SA.

The fifth connection electrode CNE5_3 may include a first extending portion CN_E1 disposed on the first insulating layer PAS1 to overlap the third electrode RME3_3, a second extending portion CN_E2 disposed on the first insulating layer PAS1 to overlap the fourth electrode RME4_3, and a first connecting portion CN_B1 electrically connecting the first extending portion CNE_1 and the second extending portion CN_E2. The first connecting portion CN_B1 may be disposed on a first bank BNL1 located on a second side of the emission area EMA in the first direction DR1 and may extend in the second direction DR2. However, the disclosure is not limited thereto, and the first connecting portion CN_B1 of the fifth connection electrode CNE5_3 may also be disposed in the emission area EMA. The fifth connection electrode CNE5_3 may partially surround an outer surface of the second connection electrode CNE2_3 in a plan view. The first extending portion CN_E1 may be spaced apart from the first connection electrode CNE1_3 in the second direction DR2, and the second extending portion CN_E2 may be spaced apart from the second connection electrode CNE2_3 in the second direction DR2. The first extending portion CN_E1 may electrically contact second ends of the first light emitting elements ED1, and the second extending portion CN_E2 may electrically contact the first ends of the third light emitting elements ED3. The first light emitting elements ED1 and the third light emitting elements ED3 may be electrically connected in series to each other through the fifth connection electrode CNE5_3.

The first extending portion CN_E1 and the second extending portion CN_E2 may be disposed over the emission area EMA and the subarea SA and may electrically contact the third electrode RME3_3 and the fourth electrode RME4_3, respectively, through a fourth contact portion CT4 and a fifth contact portion CT5 penetrating the first insulating layer PAS1 in the subarea SA. The third electrode RME3_3 and the fourth electrode RME4_3 may not be directly connected to the fourth conductive layer disposed under them but may not be floating because electrical signals are transmitted to them through the fifth connection electrode CNE5_3.

The sixth connection electrode CNE6_3 may include a third extending portion CN_E3 disposed on the second insulating layer PAS2 to overlap the third electrode RME3_3 and the first extending portion CN_E1, a fourth extending portion CN_E4 disposed on the second insulating layer PAS2 to overlap the fourth electrode RME4_3 and the second extending portion CN_E2, and a second connecting portion CN_B2 electrically connecting the third extending portion CN_E3 and the fourth extending portion CN_E4. The second connecting portion CN_B2 may overlap the first connecting portion CN_B1. However, the disclosure is not limited thereto, and the second connecting portion CN_B2 of the sixth connection electrode CNE6_3 may also be disposed in the emission area EMA. The sixth connection electrode CNE6_3 may partially surround an outer surface of the fourth connection electrode CNE4_3 in a plan view. The third extending portion CN_E3 may be spaced apart from the third connection electrode CNE3_3 in the second direction DR2, and the fourth extending portion CN_E4 may be spaced apart from the fourth connection electrode CNE4_3 in the second direction DR2. The third extending portion CN_E3 may electrically contact the first ends of the second light emitting elements ED2, and the fourth extending portion CN_E4 may electrically contact second ends of the fourth light emitting elements ED4. The second light emitting elements ED2 and the fourth light emitting elements ED4 may be electrically connected in series to each other through the sixth connection electrode CNE6_3.

Unlike the fifth connection electrode CNE5_3, the third extending portion CN_E3 and the fourth extending portion CN_E4 of the sixth connection electrode CNE6_3 may extend in the first direction DR1 but may be disposed in the emission area EMA and may not be disposed in the subarea SA. Of the fifth connection electrode CNE5_3, portions disposed on the fifth contact portion CT4 and the fifth contact portion CT5 in the subarea SA may not overlap the sixth connection electrode CNE6_3 in the thickness direction.

In the display device 10_3, different electrodes RME and light emitting elements ED (e.g., ED1 to ED4) disposed on different layers may be electrically connected through the connection electrodes CNE to form a four-stage series connection.

Figure 20:
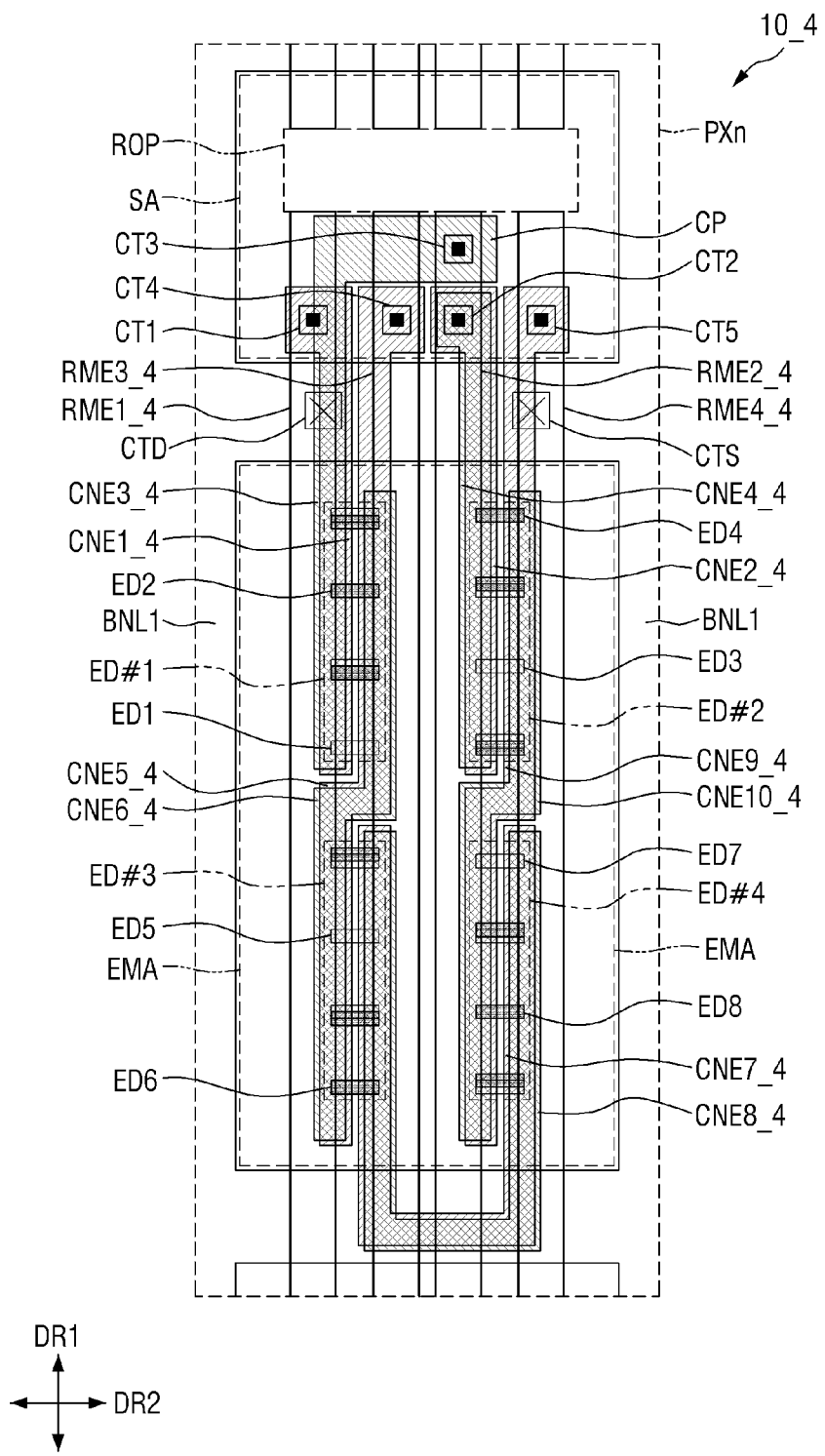
FIG. 20 is a schematic plan view of a subpixel of a display device according to an embodiment.

FIG. 20 is a schematic plan view of a subpixel PXn of a display device 10_4 according to an embodiment.

Referring to FIG. 20, the display device 10_4 according to the embodiment may include a larger number of connection electrodes CNE in each subpixel PXn so that light emitting elements ED of each subpixel PXn may form an eight-stage series connection. The embodiment may be different from the embodiment of FIG. 17 at least in the number of connection electrodes CNE disposed in each subpixel PXn of the display device 10_4 and in series connection between the light emitting elements ED. Therefore, repetitive descriptions thereof will be omitted, and the arrangement and connection of the light emitting elements ED and the connection electrodes CNE will be mainly described below.

Compared with the embodiment of FIG. 17, the display device 10_4 according to the embodiment may include first light emitting elements ED1, third light emitting elements ED3, fifth light emitting elements ED5, and seventh light emitting elements ED7, as light emitting elements ED disposed on a first insulating layer PAS1. The first light emitting elements ED1 and the fifth light emitting elements ED5 may be light emitting elements disposed on a first electrode RME1_4 and a third electrode RME3_4, and the third light emitting elements ED3 and the seventh light emitting elements ED7 may be light emitting elements disposed on a second electrode RME2_4 and a fourth electrode RME4_4. The display device 10_4 may include second light emitting elements ED2, fourth light emitting elements ED4, sixth light emitting elements ED6, and the eighth light emitting elements ED8, as light emitting elements ED disposed on a second insulating layer PAS2. The second light emitting elements ED2 and the sixth light emitting elements ED6 may be light emitting elements disposed on the first electrode RME1_4 and the third electrode RME3_4, and the fourth light emitting elements ED4 and the eighth light emitting elements ED8 may be light emitting elements disposed on the second electrode RME24 and the fourth electrode RME4_4. Similar to the embodiment of FIG. 13, relatively adjacent light emitting elements ED may form a light emitting element group ED #1, ED #2, ED #3 or ED #4. The first light emitting elements ED1 and the second light emitting elements ED2 may form a first light emitting element group ED #1, the third light emitting elements ED3 and the fourth light emitting elements ED4 may form a second light emitting element group ED #2, the fifth light emitting elements ED5 and the sixth light emitting elements ED6 may form a third light emitting element group ED #3, and the seventh light emitting elements ED7 and the eighth light emitting elements ED8 may form a fourth light emitting element group ED #4.

Connection electrodes CNE may further include fifth to tenth connection electrodes CNE5_4 to CNE10_4 in addition to first to fourth connection electrodes CNE1_4 to CNE4_4. The arrangement and connection relationship of the first to fourth connection electrodes CNE1_4 to CNE4_4 may be substantially the same as those of the embodiment of FIG. 17. However, the first to fourth connection electrodes CNE1_4 to CNE4_4 may be shorter than those of the embodiment of FIG. 17 in the first direction DR1 so that they may electrically contact only the light emitting elements ED of the first light emitting element group ED #1 and the second light emitting element group ED #2. They will not be described in detail below.

The fifth connection electrode CNE5_4 may be disposed on the first insulating layer PAS1 to overlap the third electrode RME3_4 and the first electrode RME1_4. The fifth connection electrode CNE5_4 may electrically contact second ends of the first light emitting elements ED1 and first ends of the fifth light emitting elements ED5. The fifth connection electrode CNE5_4 may electrically contact the third electrode RME3_4 through a fourth contact portion CT4 in a subarea SA. The sixth connection electrode CNE6_4 may be disposed on the second insulating layer PAS2 to overlap the third electrode RME3_4 and the first electrode RME1_4, or a portion of the fifth connection electrode CNE5_4. The sixth connection electrode CNE6_4 may electrically contact first ends of the second light emitting elements ED2 and second ends of the sixth light emitting elements ED6. The planar shapes of the fifth connection electrode CNE5_4 and the sixth connection electrode CNE6_4 may be similar to those of the fifth connection electrode CNE5_1 and the sixth connection electrode CNE6_1 of FIG. 13.

The seventh connection electrode CNE7_4 may be disposed on the first insulating layer PAS1 to overlap the third electrode RME3_4 and the fourth electrode RME4_4. The seventh connection electrode CNE7_4 may electrically contact second ends of the fifth light emitting elements ED5 and first ends of the seventh light emitting elements ED7. The eighth connection electrode CNE8_4 may be disposed on the second insulating layer PAS2 to overlap the third electrode RME3_4 and the fourth electrode RME4_4, or the seventh connection electrode CNE7_4. The eighth connection electrode CNE8_4 may electrically contact first ends of the sixth light emitting elements ED6 and second ends of the eighth light emitting elements ED8. The planar shapes of the seventh connection electrode CNE7_4 and the eighth connection electrode CNE8_4 may be similar to those of the fifth connection electrode CNE5_3 and the sixth connection electrode CNE6_3 of FIG. 17. Although the seventh connection electrode CNE7_4 and the eighth connection electrode CNE8_4 are bent on a first bank BNL1 in the drawing, but the disclosure is not limited thereto. The seventh connection electrode CNE7_4 and the eighth connection electrode CNE8_4 may also be bent in an emission area EMA.

The ninth connection electrode CNE9_4 may be disposed on the first insulating layer PAS1 to overlap the second electrode RME2_4 and the fourth electrode RME4_4. The ninth connection electrode CNE9_4 may electrically contact second ends of the seventh light emitting elements ED7 and first ends of the third light emitting elements ED3. The tenth connection electrode CNE10_4 may be disposed on the second insulating layer PAS2 to overlap the second electrode RME2_4 and the fourth electrode RME4_4, or the ninth connection electrode CNE9_4. The tenth connection electrode CNE10_4 may electrically contact first ends of the eighth light emitting elements ED8 and second ends of the fourth light emitting elements ED4. The planar shapes of the ninth connection electrode CNE9_4 and the tenth connection electrode CNE10_4 may be similar to that of the sixth connection electrode CNE6_4.

In the display device 10_4, the third light emitting elements ED3 and the fourth light emitting elements ED4 may be electrically connected in series through the second connection electrode CNE2_4 and the fourth connection electrode CNE4_4. The light emitting element groups ED #1 to ED #4 may be electrically connected in series through the connection electrodes CNE. Accordingly, in the display device 10_4, the light emitting elements ED may form an eighth-stage series connection, thereby further improving the luminance of each subpixel PXn.

As described above, each of the electrodes RME1_4 to RME4_4 may be separated by a separation portion ROP in the subarea SA. In this case, each of the electrodes RME1_4 to RME4_4 may be divided into portions disposed on a first side and a second side of the emission area EMA in the first direction DR1 by the separation portion ROP, and the portions may form different electrode groups. In an embodiment in which an electrode is divided by the separation portion ROP of the emission area EMA, some of the connection electrodes CNE which are bent in the emission area EMA to be over different electrodes RME, for example, the fifth connection electrode CNE5_4, the sixth connection electrode CNE6_4, the ninth connection electrode CNE9_4, and the tenth connection electrode CNE10_4 may have their connecting portions, which are bent portions, disposed in the separation portion ROP in the subarea SA.

Figure 21:
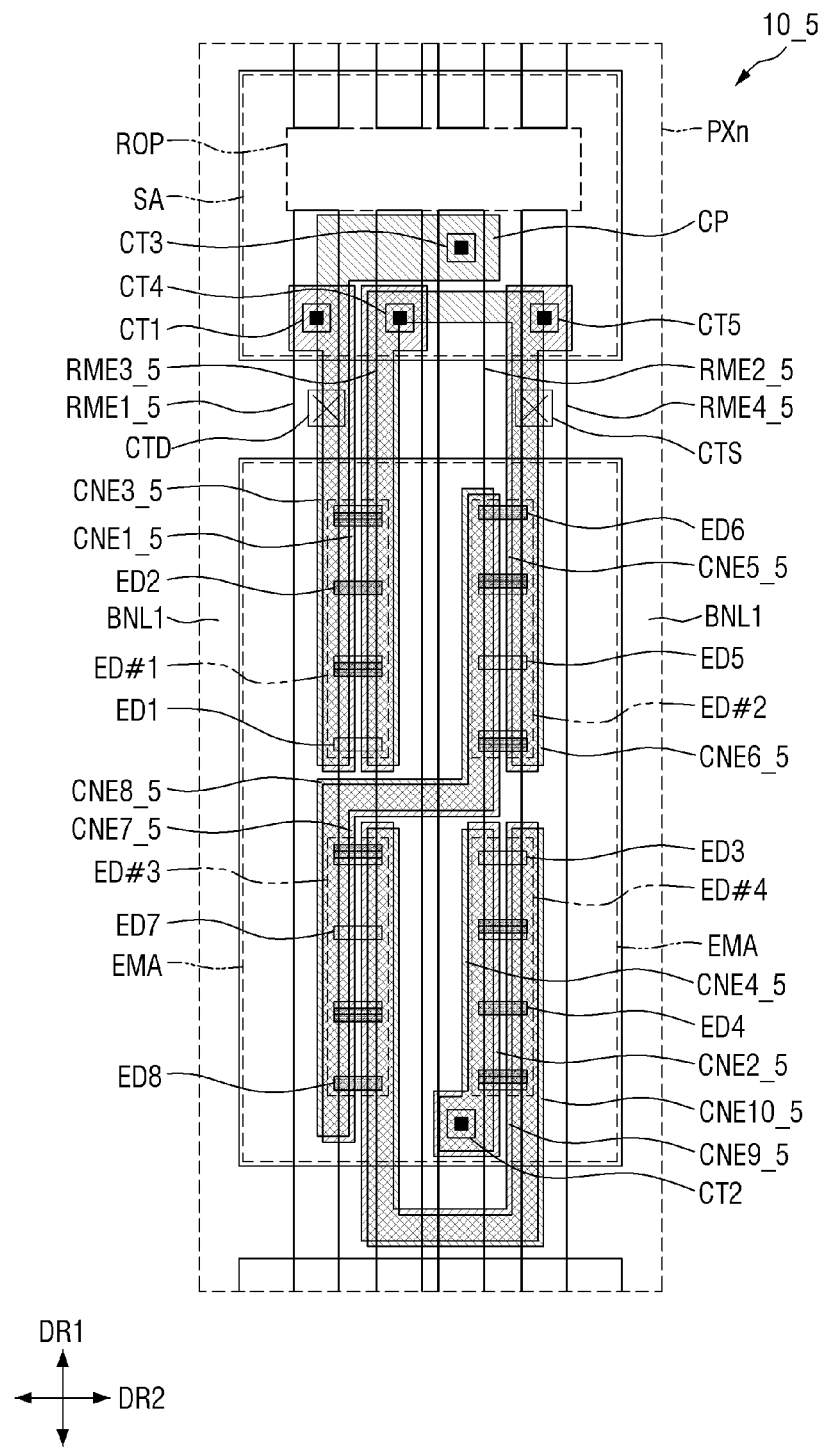
FIG. 21 is a schematic plan view of a subpixel of a display device according to an embodiment.

FIG. 21 is a schematic plan view of a subpixel PXn of a display device 10_5 according to an embodiment.

Referring to FIG. 21, the display device 10_5 according to the embodiment may be different from the display device 10_4 of FIG. 20 in the arrangement of connection electrodes CNE although light emitting elements ED of the display device 10_5 form an eight-stage series connection. The display device 10_5 according to the embodiment may be different from the display device 10_4 of FIG. 20 at least in the arrangement of the light emitting elements ED (e.g., ED1 through ED4) electrically connected in series to each other.

Compared with the embodiment of FIG. 20, in the display device 10_5 according to the embodiment, as light emitting elements disposed on a first insulating layer PAS1, first light emitting elements ED1 and seventh light emitting elements ED7 may be disposed on a first electrode RME1_5 and a third electrode RME3_5, and third light emitting elements ED3 and fifth light emitting elements ED5 may be disposed on a second electrode RME2_5 and a fourth electrode RME4_5. In the display device 10_5, as light emitting elements disposed on a second insulating layer PAS2, second light emitting elements ED2 and eighth light emitting elements ED8 may be disposed on the first electrode RME1_5 and the third electrode RME3_5, and fourth light emitting elements ED4 and sixth light emitting elements ED6 may be disposed on the second electrode RME2_5 and the fourth electrode RME4_5.

The first light emitting elements ED1 and the second light emitting elements ED2 may be electrically connected to the first electrode RME1_5 and the second electrode RME2_5, which are first type electrodes, through a first connection electrode CNE1_5 and a third connection electrode CNE3_5, respectively. The third light emitting elements ED3 and the fourth light emitting elements ED4 may be electrically connected to each other through each of a second connection electrode CNE2_5 and a fourth connection electrode CNE4_5. The second connection electrode CNE2_5 and the fourth connection electrode CNE4_5 may be electrically connected to each other through a second contact portion CT2 penetrating the second insulating layer PAS2. In some embodiments, the second contact portion CT2 may be formed in an emission area EMA, but the disclosure is not limited thereto. Similar to the third contact portion CT3 in the embodiment of FIG. 17, the second contact portion CT2 may also be disposed in a subarea SA of another subpixel PXn, rather than in the emission area EMA.

The fifth light emitting elements ED5 may be electrically connected to the first connection electrode CNE1_5 through a fifth connection electrode CNE5_5, the seventh light emitting elements ED7 may be electrically connected to the fifth light emitting elements ED5 through a seventh connection electrode CNE7_5, and the third light emitting elements ED3 may be electrically connected to the seventh light emitting elements ED7 through a ninth connection electrode CNE9_5.

The fifth connection electrode CNE5_5 may be disposed on the first insulating layer PAS1 and may be bent in the subarea SA to overlap the third electrode RME3_5 and the fourth electrode RME4_5. Of the fifth connection electrode CNE5_5, a portion disposed in an emission area EMA may electrically contact second ends of the first light emitting elements ED1 and first ends of the fifth light emitting elements ED5, and a portion disposed in the subarea SA may electrically contact the third electrode RME3_5 and the fourth electrode RME4_5 through a fourth contact portion CT4 and a fifth contact portion CT5.

The seventh connection electrode CNE7_5 may be disposed on the first insulating layer PAS1 and may be bent in the emission area EMA to overlap the second electrode RME2_5 and the first electrode RME1_5. The seventh connection electrode CNE7_5 may electrically contact second ends of the fifth light emitting elements ED5 and first ends of the seventh light emitting elements ED7. The planar shape of the seventh connection electrode CNE7_5 may be similar to that of the fifth connection electrode CNE5_4 of FIG. 20, but the seventh connection electrode CNE7_5 may be different from the fifth connection electrode CNE5_4 of FIG. 20 at least in that a bent portion of the seventh connection electrode CNE7_5 is longer than that of the fifth connection electrode CNE5_4 of FIG. 20 in the second direction DR2 and is disposed over the second electrode RME2_5 and the first electrode RME1_5.

The ninth connection electrode CNE9_5 may also be disposed on the first insulating layer PAS1 and may be bent on a first bank BNL1 to overlap the third electrode RME3_5 and the fourth electrode RME4_5. Of the ninth connection electrode CNE9_5, a portion disposed in the emission area EMA may electrically contact second ends of the seventh light emitting elements ED7 and first ends of the third light emitting elements ED3. The planar shape of the ninth connection electrode CNE9_5 may be similar to that of the seventh connection electrode CNE7_4 of FIG. 20.

The fourth light emitting elements ED4 may be electrically connected to the eighth light emitting elements ED8 through a tenth connection electrode CNE10_5, the eighth light emitting elements ED8 may be electrically connected to the sixth light emitting elements ED6 through an eighth connection electrode CNE8_5, and the sixth light emitting elements ED6 may be electrically connected to the third connection electrode CNE3_5 through a sixth connection electrode CNE6_5.

The tenth connection electrode CNE10_5 may be disposed on the second insulating layer PAS2 to overlap the ninth connection electrode CNE9_5. The tenth connection electrode CNE10_5 may also be bent on the first bank BNL1, and a portion of the tenth connection electrode CNE10_5 disposed in the emission area EMA may electrically contact second ends of the fourth light emitting elements ED4 and first ends of the eighth light emitting elements ED8. The planar shape of the tenth connection electrode CNE10_5 may be identical to that of the ninth connection electrode CNE9_5.

The eighth connection electrode CNE8_5 may be disposed on the second insulating layer PAS2 to overlap the seventh connection electrode CNE7_5. The eighth connection electrode CNE8_5 may also bent in the emission area EMA and may electrically contact second ends of the eighth light emitting elements ED8 and first ends of the sixth light emitting elements ED6. The planar shape of the eighth connection electrode CNE8_5 may be identical to that of the seventh connection electrode CNE7_5.

The sixth connection electrode CNE6_5 may be disposed on the second insulating layer PAS2 to overlap the fifth connection electrode CNE5_5. The sixth connection electrode CNE6_5 may also be bent in the subarea SA and may electrically contact second ends of the sixth light emitting elements ED6 and first ends of the second light emitting elements ED2. The planar shape of the sixth connection electrode CNE6_5 may be similar to that of the fifth connection electrode CNE5_5, but the sixth connection electrode CNE6_5 may be different from the fifth connection electrode CNE5_5 at least in that the sixth connection electrode CNE6_5 does not electrically contact electrodes RME through the fourth and fifth contact portions CT4 and CT5 in the subarea SA.

Although the sixth connection electrode CNE6_5 is bent in the subarea SA and the ninth connection electrode CNE9_5 and the tenth connection electrode CNE10_5 are bent on the first bank BNL1 in the drawing, but the disclosure is not limited thereto. They may also be bent in the emission area EMA.

In the display device 10_5, the light emitting elements ED may form an eight-stage series connection, thereby improving the luminance of each subpixel PXn. Connection electrodes CNE disposed over electrodes RME may be located at the same position on the electrodes RME. For example, portions of the fifth connection electrode CNE5_5 which are disposed in the emission area EMA may be disposed on a second side of the third electrode RME3_5 in the second direction DR2 and a second side of the fourth electrode RME4_5 in the second direction DR2, respectively. Similarly, portions of the seventh connection electrode CNE7_5 which are disposed in the emission area EMA may be disposed on a first side of the second electrode RME2_5 in the second direction DR2 and a first side of the first electrode RME1_5 in the second direction DR2, respectively. In the embodiment, the light emitting elements ED may form an eight-stage series connection as in the embodiment of FIG. 20, but the arrangement of the connection electrodes CNE may be changed to readily design an overlay of the connection electrodes CNE on the electrodes RME.

Figure 22:
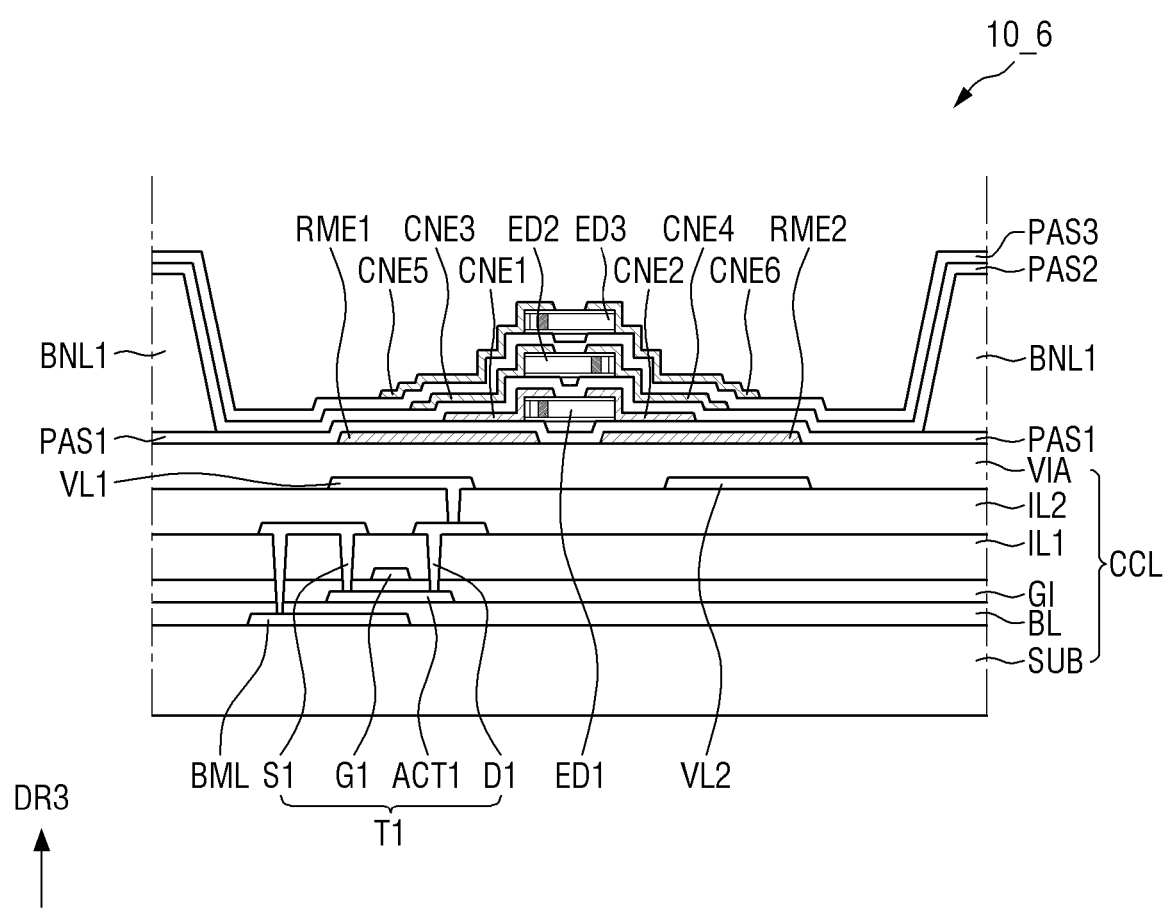
FIG. 22 is a schematic cross-sectional view of a portion of a display device according to an embodiment.

FIG. 22 is a schematic cross-sectional view of a portion of a display device 10_6 according to an embodiment.

Referring to FIG. 22, the display device 10_6 according to the embodiment may further include a third insulating layer PAS3 and third light emitting elements ED3 disposed on second light emitting elements ED2. Since the display device 10_6 includes first light emitting elements ED1 and the second light emitting elements ED2 and may further include the third light emitting elements ED3 stacked on them in the thickness direction, the number of light emitting elements ED disposed per unit area may be further increased.

The third insulating layer PAS3 may be disposed on the second light emitting elements ED2 and a second connection electrode layer CNL2. The third insulating layer PAS3 may be entirely disposed on a second insulating layer PAS2 and may cover or overlap the second light emitting elements ED2, a third connection electrode CNE3, and a fourth connection electrode CNE4.

The third light emitting elements ED3 may be directly disposed on the third insulating layer PAS3. Similar to the first light emitting elements ED1, the third light emitting elements ED3 may be disposed such that both ends are on a first electrode RME1 and a second electrode RME2. First ends of the third light emitting elements ED3 may be on the first electrode RME1, and second ends of the third light emitting elements ED3 may be on the second electrode RME2. For example, an orientation direction of the first ends of the third light emitting elements ED3 may be identical to an orientation direction of first ends of the first light emitting elements ED1 but be opposite to an orientation direction of first ends of the second light emitting elements ED2.

A fifth connection electrode CNE5 may be disposed on the third insulating layer PAS3 to overlap the first electrode RME1 and the third connection electrode CNE3. A sixth connection electrode CNE6 may be disposed on the third insulating layer PAS3 to overlap the second electrode RME2 and the fourth connection electrode CNE4. The fifth connection electrode CNE5 may electrically contact the first ends of the third light emitting elements ED3, and the sixth connection electrode CNE6 may electrically contact the second ends of the third light emitting elements ED3.

Although not illustrated in the drawing, the third connection electrode CNE3 may electrically contact the fifth connection electrode CNE5 through a contact portion penetrating the third insulating layer PAS3, and the sixth connection electrode CNE6 may electrically contact the second electrode RME2 through a contact portion penetrating a first insulating layer PAS1, the second insulating layer PAS2 and the third insulating layer PAS3. Unlike in the embodiment of FIG. 3, the third connection electrode CNE3 may not have an electrode extension portion CP. The second light emitting elements ED2 may be electrically connected in series to the third light emitting elements ED3 through connection electrodes CNE disposed on the third insulating layer PAS3.

Figure 23:
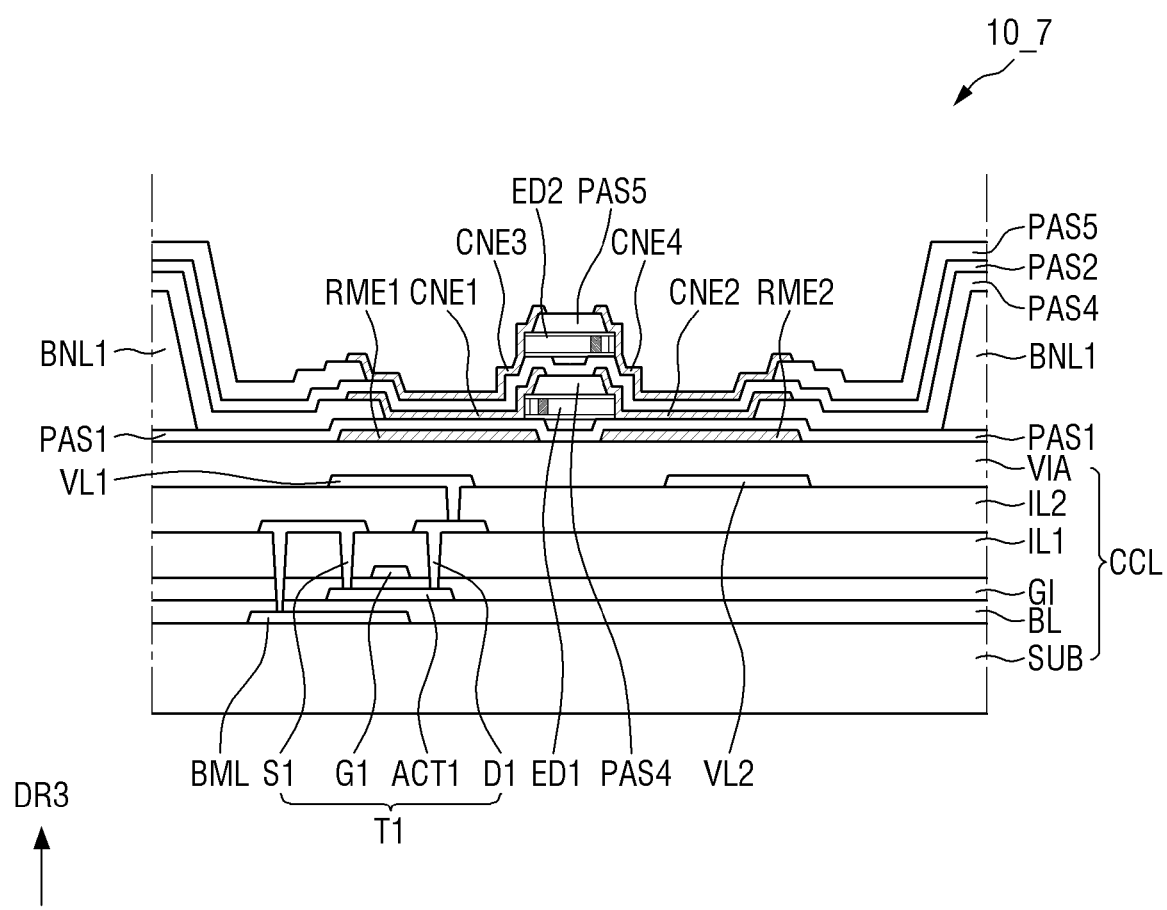
FIG. 23 is a schematic cross-sectional view of a portion of a display device according to an embodiment.

FIG. 23 is a schematic cross-sectional view of a portion of a display device 10_7 according to an embodiment.

Referring to FIG. 23, the display device 10_7 according to the embodiment may further include insulating layers which fix alignment positions of light emitting elements ED during a process of manufacturing the display device 10_7. The display device 10_7 may further include a fourth insulating layer PAS4 disposed on first light emitting elements ED1 and a fifth insulating layer PAS5 disposed on second light emitting elements ED2. The fourth insulating layer PAS4 and the fifth insulating layer PAS5 may partially overlap the light emitting elements ED (e.g., ED1 and ED2) before a process of forming connection electrodes CNE. The fourth insulating layer PAS4 and the fifth insulating layer PAS5 may prevent the light emitting elements ED from being displaced in the process of forming the connection electrodes CNE. This embodiment may be different from the embodiment of FIG. 4 at least in that it further includes the fourth insulating layer PAS4 and the fifth insulating layer PAS5 disposed on the first light emitting elements ED1 and the second light emitting elements ED2.

The fourth insulating layer PAS4 may be partially disposed on a first insulating layer PAS1 and the first light emitting elements ED1. For example, the fourth insulating layer PAS4 may partially overlap an outer surface of each first light emitting element ED1 and may not overlap both ends of each first light emitting element ED1. Of the fourth insulating layer PAS4, a portion disposed on the first light emitting elements ED1 may extend in the first direction DR1 on the first insulating layer PAS1 in a plan view to form a linear or island-shaped pattern in each subpixel PXn.

The fifth insulating layer PAS5 may be partially disposed on a second insulating layer PAS2 and the second light emitting elements ED2. For example, the fifth insulating layer PAS5 may partially overlap an outer surface of each second light emitting element ED2 and may not overlap both ends of each second light emitting element ED2. Of the fifth insulating layer PAS5, a portion disposed on the second light emitting elements ED2 may extend in the first direction DR1 on the second insulating layer PAS2 in a plan view to form a linear or island-shaped pattern in each subpixel PXn.

The fourth insulating layer PAS4 and the fifth insulating layer PAS5 may protect the light emitting elements ED (e.g., ED1 and ED2) while fixing the light emitting elements ED during the manufacturing process of the display device 10_7.

Connection electrodes CNE1 and CNE2 of a first connection electrode layer CNL1 may be spaced apart from each other on the fourth insulating layer PAS4. A first connection electrode CNE1 may electrically contact first ends of the first light emitting elements ED1, and a portion of the first connection electrode CNE1 may be disposed on the fourth insulating layer PAS4. A second connection electrode CNE2 may electrically contact second ends of the first light emitting elements ED1, and a portion of the second connection electrode CNE2 may be disposed on the fourth insulating layer PAS4. The first connection electrode CNE1 and the second connection electrode CNE2 may be spaced apart from each other in the second direction DR2 on a portion of the fourth insulating layer PAS4 which overlaps the first light emitting elements ED1.

Likewise, connection electrodes CNE3 and CNE4 of a second connection electrode layer CNL2 may be spaced apart from each other on the fifth insulating layer PAS5. A third connection electrode CNE3 may electrically contact second ends of the second light emitting elements ED2, and a portion of the third connection electrode CNE3 may be disposed on the fifth insulating layer PAS5. A fourth connection electrode CNE4 may electrically contact first ends of the second light emitting elements ED2, and a portion of the fourth connection electrode CNE4 may be disposed on the fifth insulating layer PAS5. The third connection electrode CNE3 and the fourth connection electrode CNE4 may be spaced apart from each other in the second direction DR2 on a portion of the fifth insulating layer PAS5 which overlaps the second light emitting elements ED2.

Since the display device 10_7 according to the embodiment further includes the insulating layers PAS4 and PAS5 overlapping the light emitting elements ED (e.g., ED1 and ED2), the light emitting elements ED may be prevented from being displaced in the manufacturing process.

Figure 24:
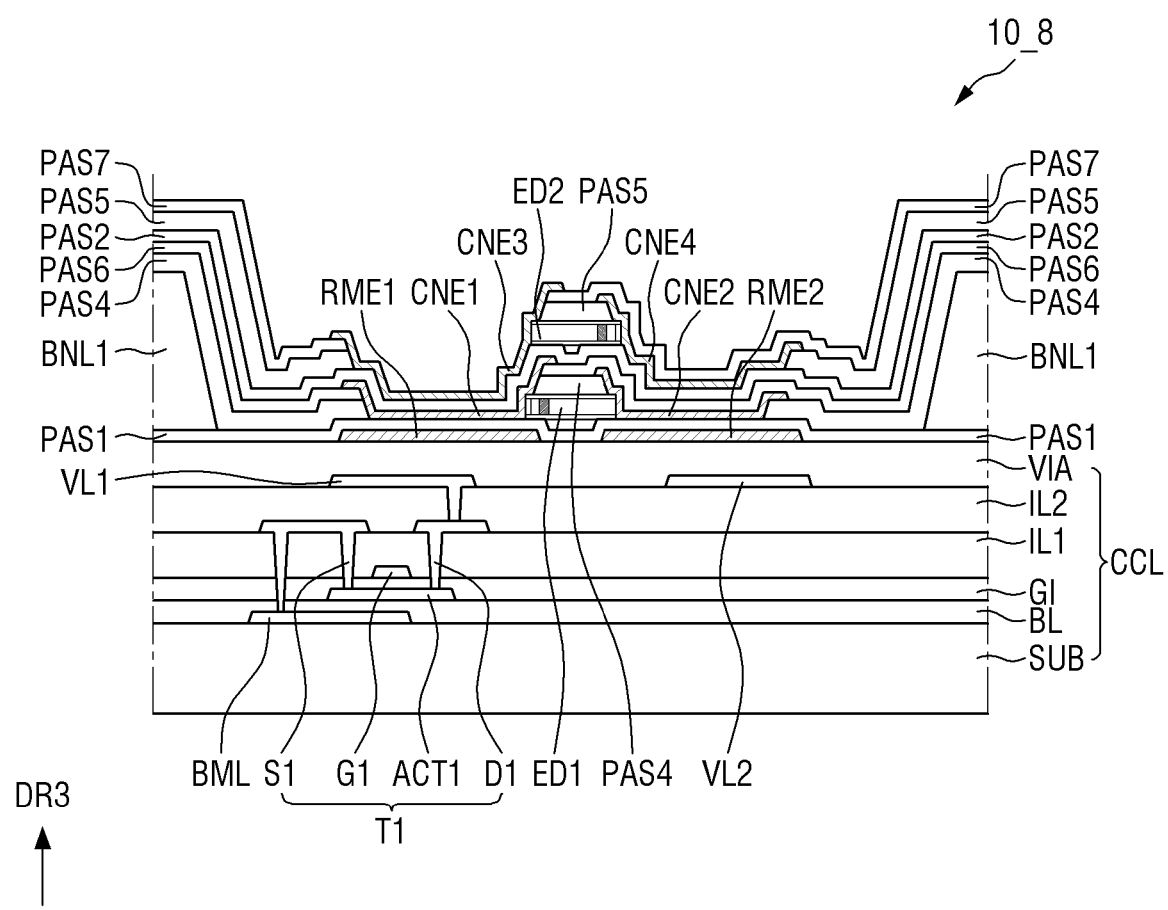
FIG. 24 is a schematic cross-sectional view of a portion of a display device according to an embodiment.

FIG. 24 is a schematic cross-sectional view of a portion of a display device 10_8 according to an embodiment.

Referring to FIG. 24, in the display device 10_8 according to the embodiment, connection electrodes CNE of each connection electrode layer CNL may be disposed on different layers. The display device 10_8 may further include a sixth insulating layer PAS6 and a seventh insulating layer PAS7 so that a first connection electrode CNE1 and a second connection electrode CNE2 are disposed on a layer different from a third connection electrode CNE3 and a fourth connection electrode CNE4. This embodiment may be different from the embodiment of FIG. 23 at least in that the display device 10_8 includes more insulating layers PAS6 and PAS7.

The sixth insulating layer PAS6 may be disposed on a first insulating layer PAS1, a fourth insulating layer PAS4, and the second connection electrode CNE2. The sixth insulating layer PAS6 may be entirely disposed on the first insulating layer PAS1 and the fourth insulating layer PAS4 but may expose first ends of first light emitting elements ED1 on which the first connection electrode CNE1 is disposed. A portion of the first connection electrode CNE1 may be disposed on the sixth insulating layer PAS6, and the first connection electrode CNE1 and the second connection electrode CNE2 may be insulated from each other by the sixth insulating layer PAS6.

Likewise, the seventh insulating layer PAS7 may be disposed on a second insulating layer PAS2, a fifth insulating layer PAS5, and the fourth connection electrode CNE4. The seventh insulating layer PAS7 may be entirely disposed on the second insulating layer PAS2 and the fifth insulating layer PAS5 but may expose second ends of second light emitting elements ED2 on which the third connection electrode CNE3 is disposed. A portion of the third connection electrode CNE3 may be disposed on the seventh insulating layer PAS7, and the third connection electrode CNE3 and the fourth connection electrode CNE4 may be insulated from each other by the seventh insulating layer PAS7.

In the above embodiments, connection electrodes CNE disposed in the same connection electrode layer CNL may be formed simultaneously. However, in the display device 10_8 according to an embodiment, since at least one insulating layer is disposed between the connection electrodes CNE, the connection electrodes CNE may be formed by different processes. For example, in case that the fourth insulating layer PAS4 is formed after the first light emitting elements ED1 are placed, the second connection electrode CNE2 may be formed first, and the sixth insulating layer PAS6 and the first connection electrode CNE1 may be sequentially formed. In case that the fifth insulating layer PAS5 is formed after the second light emitting elements ED2 are placed, the fourth connection electrode CNE4 may be formed first, and then the seventh insulating layer PAS7 and the third connection electrode CNE3 may be sequentially formed. In the display device 10_8 according to the embodiment, connection electrodes CNE electrically contacting the same light emitting elements ED (e.g., ED1 or ED2) may be insulated from each other through an insulating layer (e.g., the sixth insulating layer PAS6 or the seventh insulating layer PAS7). Therefore, a short circuit problem due to residues of connection electrode materials in a manufacturing process may be prevented.

Figure 25:
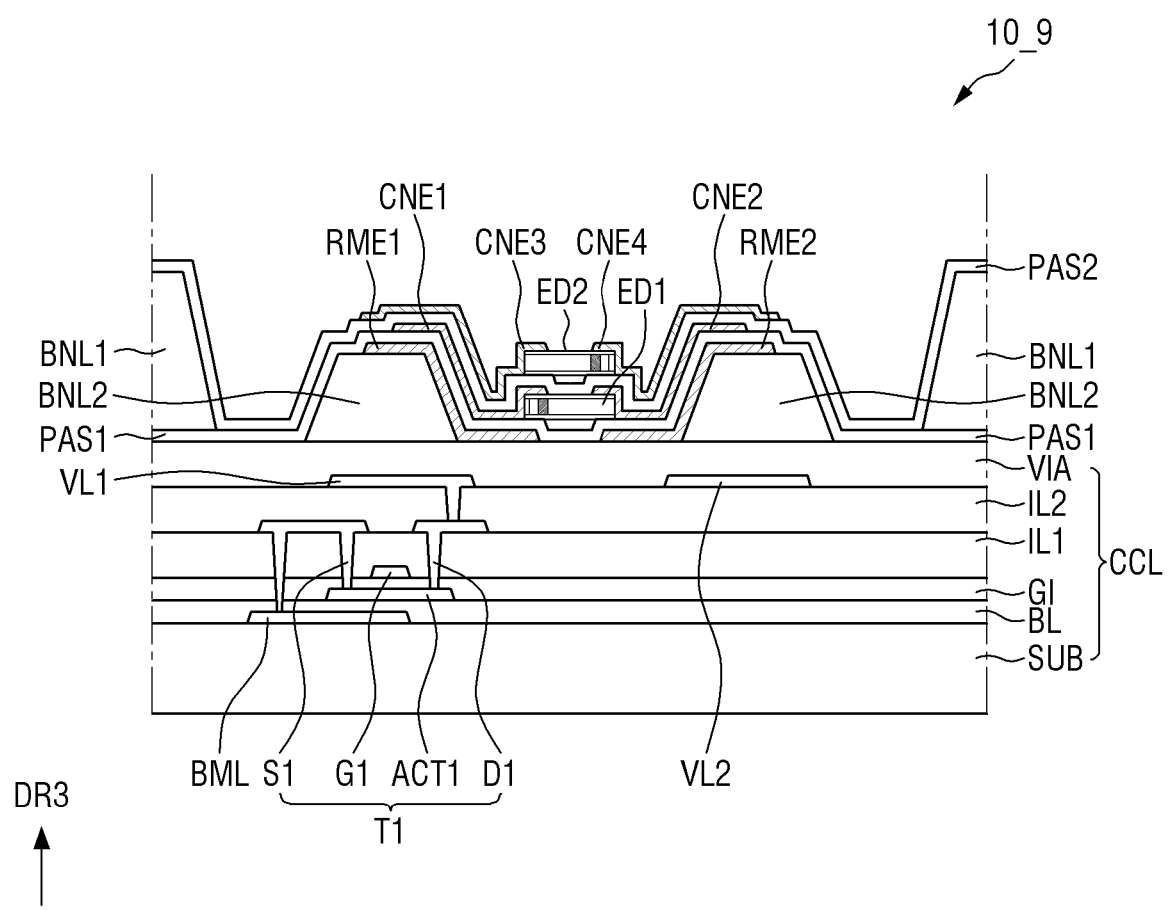
FIG. 25 is a schematic cross-sectional view of a portion of a display device according to an embodiment.

FIG. 25 is a schematic cross-sectional view of a portion of a display device 10_9 according to an embodiment.

Referring to FIG. 25, the display device 10_9 according to the embodiment may further include second banks BNL2 disposed between electrodes RME and a via layer VIA. portions of the electrodes RME which are disposed in an emission area EMA may be disposed on the second banks BNL2, and light emitting elements ED may be disposed between the second banks BNL2 spaced apart from each other. The display device 10_9 of this embodiment may be different from the embodiment of FIG. 4 at least in that it further includes the second banks BNL2 disposed under the electrodes RME.

The second banks BLN2 may be directly disposed on the via layer VIA. The second banks BNL2 may extend in the first direction DR1 in a center of the emission area EMA. In the display device 10_9, the second banks BNL2 may be disposed in each subpixel PXn and may be spaced apart from each other. For example, the second banks BNL2 may be spaced apart from each other in the second direction DR2 in each emission area EMA. A first electrode RME1 and a second electrode RME2 may be disposed on different second banks BNL2, respectively.

A length of each second bank BNL2 in the first direction DR1 may be smaller than a length of an area surrounded by a first bank BNL1 in the first direction DR1. For example, the second banks BNL2 may be disposed in the emission area EMA of each subpixel PXn to form island-shaped patterns having a relatively narrow width and extending in a direction in the entire display area DPA.

A least a portion of each second bank BNL2 may protrude from an upper surface of the via layer VIA. The protruding portion of each second bank BNL2 may have inclined side surfaces. However, the disclosure is not limited thereto, and each second bank BNL2 may also be shaped like a semicircle or a semi-ellipse with a curved outer surface. The second banks BNL2 may include, but are not limited to, an organic insulating material such as polyimide (PI).

In an embodiment, widths of the first electrode RME1 and the second electrode RME2 measured in the second direction DR2 may be smaller than those of the second banks BNL2.

Each of the first electrode RME1 and the second electrode RME2 may overlap only a side surface of a second bank BNL2. However, the disclosure is not limited thereto. Widths of the electrodes RME measured in the second direction DR2 may also be greater than those of the second banks BNL2, and each of the electrodes RME may overlap both side surfaces of a second bank BNL2. Each of the electrodes RME may overlap at least one side surface of a second bank BNL2 to reflect light emitted from the light emitting elements ED.

A gap between the electrodes RME in the second direction DR2 may be smaller than a gap between the second banks BNL2. Even if the display device 10_9 further includes the second banks BNL2, at least a portion of each electrode RME may be directly disposed on the via layer VIA so that the electrodes RME are disposed in the same plane.

In an embodiment, each of the first electrode RME1 and the second electrode RME2 may overlap at least one side surface of a second bank BNL2. Each of the second banks BNL2 may have a predetermined height and have inclined or curved side surfaces, and the light emitting elements ED may be disposed between the second banks BNL2 spaced apart from each other in the second direction DR2. Light generated by the light emitting elements ED may be emitted toward both ends of the light emitting elements ED and may travel toward the electrodes RME disposed on the side surfaces of the second banks BNL2. As described above, the electrodes RME may include a material having high reflectivity, and the light emitted from the light emitting elements ED may be reflected toward above the via layer VIA by the electrodes RME. Since the display device 10_9 further includes the second banks BNL2 disposed between the via layer VIA and the electrodes RME, front emission efficiency may be improved.

A display device according to an embodiment may include a large number of light emitting elements per unit area by including light emitting elements disposed on different layers. Light emitting elements disposed on different layers may be electrically connected in series to each other through connection electrodes, thereby improving luminance per unit area.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device, comprising:
   a substrate;
   a first electrode and a second electrode which are disposed on the substrate and spaced apart from each other;
   a first insulating layer which is disposed on the first electrode and the second electrode;
   a plurality of first light emitting elements which are disposed on the first insulating layer, each of the plurality of first light emitting elements including a first end and a second end disposed on the first electrode and the second electrode, respectively;
   a first connection electrode which is disposed on the first electrode to electrically contact the first end of each of the plurality of first light emitting elements;
   a second connection electrode which is disposed on the second electrode to electrically contact the second end of each of the plurality of first light emitting elements;
   a second insulating layer which is disposed on the plurality of first light emitting elements, the first connection electrode, and the second connection electrode;
   a plurality of second light emitting elements which are disposed on the second insulating layer, each of the plurality of second light emitting elements including a first end and a second end disposed on the second electrode and the first electrode, respectively;
   a third connection electrode which is disposed on the first connection electrode to electrically contact the second end of each of the plurality of second light emitting elements; and
   a fourth connection electrode which is disposed on the second connection electrode to electrically contact the first end of each of the plurality of second light emitting elements,
   wherein
   the first connection electrode electrically contacts the first electrode through a first contact portion penetrating the first insulating layer,
   the fourth connection electrode electrically contacts the second connection electrode through a second contact portion penetrating the second insulating layer, and
   the third connection electrode electrically contacts the second electrode through a third contact portion penetrating the first insulating layer and the second insulating layer.

2. The display device of claim 1, wherein at least a part of the plurality of second light emitting elements overlap the plurality of first light emitting elements in a thickness direction of the display device.

3. The display device of claim 2, wherein
   each of the plurality of first light emitting elements and each of the plurality of second light emitting elements comprises a first semiconductor layer, a second semiconductor layer, and a light emitting layer disposed between the first semiconductor layer and the second semiconductor layer, and
   the first end of each of the plurality of first light emitting elements at which the first semiconductor layer is disposed and the first end of each of the plurality of second light emitting elements at which the first semiconductor layer is disposed face opposite directions.

4. The display device of claim 1, wherein
   the third connection electrode comprises an electrode extension portion disposed across the first electrode and the second electrode, and
   the electrode extension portion electrically contacts the second electrode through the third contact portion.

5. The display device of claim 1, wherein the second connection electrode is not directly connected to the first electrode and the second electrode.

6. The display device of claim 1, further comprising:
   a conductive layer which comprises a plurality of voltage wirings and a conductive pattern disposed on the substrate; and
   a via layer which is disposed between the conductive layer and the first and second electrodes, wherein
   the first electrode is electrically connected to the conductive pattern through a first electrode contact hole penetrating the via layer, and
   the second electrode is electrically connected to one of the plurality of voltage wirings through a second electrode contact hole penetrating the via layer.

7. The display device of claim 1, further comprising:
   an emission area; and
   a subarea which is spaced apart from the emission area in a first direction, wherein
   the plurality of first light emitting elements and the plurality of second light emitting elements are disposed in the emission area,
   the first electrode and the second electrode extend in the first direction across the emission area and the subarea, and
   the first contact portion and the third contact portion are disposed in the subarea.

8. The display device of claim 1, further comprising:
   a third electrode which is spaced apart from the first electrode, the second electrode being disposed between the first electrode and the third electrode;
   a plurality of third light emitting elements which are disposed on the first insulating layer, the second electrode, and the third electrode; and
   a plurality of fourth light emitting elements which are disposed on the second electrode and the third electrode, wherein
   the second insulating layer is also disposed on the plurality of third light emitting elements, and
   the plurality of fourth light emitting elements are directly disposed on the second insulating layer.

9. The display device of claim 8, wherein
   the first connection electrode comprises:
   a first portion disposed on the first electrode;
   a second portion disposed on the third electrode to electrically contact a first end of each of the plurality of third light emitting elements; and
   a third portion electrically connecting the first portion and the second portion, the third connection electrode comprises:
  a fourth portion disposed on the first portion;
  a fifth portion disposed on the second portion to electrically contact a second end of each of the plurality of fourth light emitting elements; and
  a sixth portion electrically connecting the fourth portion and the fifth portion,
the second connection electrode electrically contacts a second end of each of the plurality of third light emitting elements, and
the fourth connection electrode electrically contacts a first end of each of the plurality of fourth light emitting elements.

10. A display device, comprising:
a substrate;
a first electrode and a second electrode which are disposed on the substrate and spaced apart from each other;
a first insulating layer which is disposed on the first electrode and the second electrode;
a plurality of first light emitting elements which are disposed on the first insulating layer, each of the plurality of first light emitting elements including a first end and a second end disposed on the first electrode and the second electrode, respectively;
a first connection electrode which is disposed on the first electrode to electrically contact the first end of each of the plurality of first light emitting elements;
a second connection electrode which is disposed on the second electrode to electrically contact the second end of each of the plurality of first light emitting elements;
a second insulating layer which is disposed on the plurality of first light emitting elements, the first connection electrode, and the second connection electrode;
a plurality of second light emitting elements which are disposed on the second insulating layer, each of the plurality of second light emitting elements including a first end and a second end disposed on the second electrode and the first electrode, respectively;
a third connection electrode which is disposed on the first connection electrode to electrically contact the second end of each of the plurality of second light emitting elements; and
a fourth connection electrode which is disposed on the second connection electrode to electrically contact the first end of each of the plurality of second light emitting elements,
wherein the display device further comprises a first bank which is disposed on the first insulating layer to surround an area in which the plurality of first light emitting elements and the plurality of second light emitting elements are disposed,
wherein the second insulating layer is also disposed on the first bank.

11. The display device of claim 10, further comprising:
a third insulating layer which is disposed on the plurality of second light emitting elements, the third connection electrode, and the fourth connection electrode;
a plurality of third light emitting elements which are disposed on the third insulating layer, each of the plurality of third light emitting elements including a first end and a second end disposed on the first electrode and the second electrode, respectively;
a fifth connection electrode which is disposed on the third connection electrode to electrically contact the first end of each of the plurality of third light emitting elements; and
a sixth connection electrode which is disposed on the fourth connection electrode to electrically contact the second end of each of the plurality of third light emitting elements.

12. The display device of claim 10, further comprising:
a third insulating layer which is disposed between the plurality of first light emitting elements and the second insulating layer; and
a fourth insulating layer which is disposed on the plurality of second light emitting elements, wherein
a portion of the first connection electrode and a portion of the second connection electrode are disposed on the third insulating layer, and
a portion of the third connection electrode and a portion of the fourth connection electrode are disposed on the fourth insulating layer.

13. The display device of claim 12, further comprising:
a fifth insulating layer which is disposed between the second connection electrode and the second insulating layer; and
a sixth insulating layer which is disposed on the fourth connection electrode, wherein
the portion of the first connection electrode is disposed on the fifth insulating layer, and
the portion of the third connection electrode is disposed on the sixth insulating layer.

14. The display device of claim 10, further comprising:
a plurality of second banks which are disposed between the substrate and the first electrode and between the substrate and the second electrode and are spaced apart from each other,
wherein the plurality of first light emitting elements are disposed between the plurality of second banks.

* * * * *